United States Patent [19]

Miyashita et al.

[11] Patent Number: 5,477,325
[45] Date of Patent: Dec. 19, 1995

[54] METHOD FOR EVALUATING EPITAXIAL LAYERS AND TEST PATTERN FOR PROCESS EVALUATION

[75] Inventors: Motoharu Miyashita; Nobuyoshi Ogasawara; Tadashi Kimura, all of Itami, Japan

[73] Assignee: Mitsubishi Denki Kabushiki Kaisha, Tokyo, Japan

[21] Appl. No.: 253,568

[22] Filed: Jun. 3, 1994

[30] Foreign Application Priority Data

Jun. 7, 1993 [JP] Japan .................. 5-135564

[51] Int. Cl.⁶ ............................ G01B 11/06
[52] U.S. Cl. ............................ 356/381; 117/85
[58] Field of Search ........................ 356/381, 369; 250/560, 225, 559.27; 437/89; 117/85, 86

[56] References Cited

FOREIGN PATENT DOCUMENTS 2252694  10/1990  Japan .
3174739  7/1991  Japan .

OTHER PUBLICATIONS

Bilenko et al., "Monitoring the Thickness of Layers During the Process of Selective Accretion or Etching," Saratou State University, Translated from Pribory i Tekhnika Eksperimenta, No. 5, pp. 231–233, Sep.–Oct. 1972.

Primary Examiner—Richard A. Rosenberger
Assistant Examiner—K. P. Hantis
Attorney, Agent, or Firm—Leydig, Voit & Mayer

[57] ABSTRACT

In a method for evaluating thickness of a semiconductor layer epitaxially growing on a main surface of a substrate, a parallel stripe-shaped ridges extending are formed on the surface of the substrate, and a semiconductor layer is epitaxially grown on the surface of the substrate including the stripe-shaped ridges while irradiating the stripe-shaped ridges with light and monitoring from the stripe-shaped ridges to evaluate the thickness of the epitaxially growing semiconductor layer. The thickness of the epitaxial layer is evaluated with high precision during the epitaxial growth process.

16 Claims, 18 Drawing Sheets

METHOD FOR EVALUATING EPITAXIAL LAYERS AND TEST PATTERN FOR PROCESS EVALUATION

FIELD OF THE INVENTION

The present invention relates to a method for evaluating a semiconductor layer epitaxially grown on a substrate and, more particularly, to a method for evaluating the thickness of that layer during the epitaxial growth process with high precision.

The present invention also relates to a test pattern for process evaluation which is disposed on a substrate and used for evaluating semiconductor layers epitaxially grown on the substrate.

The present invention also relates to a method for evaluating an AlGaAs multiple quantum well layer and, more particularly, to a method for evaluating the thickness and Al composition of the multiple quantum well layer with high precision.

BACKGROUND OF THE INVENTION

FIGS. 17(a) and 17(b) are perspective views for explaining a conventional method for measuring the thickness of a semiconductor layer epitaxially grown on a substrate. In these figures, reference numeral 101 designates a GaAs substrate and numeral 102 designates an epitaxial layer grown on the GaAs substrate 101.

Initially, as illustrated in FIG. 17(a), an epitaxial layer 102 is grown on the GaAs substrate 101 having a diameter of 2 inches by MOCVD. The thickness of the epitaxial layer 102 is controlled by the growth time according to the growth rate which is controlled by the quantity of the supplied source gas. Thereafter, this wafer is cleaved to make a strip sample 103 shown in FIG. 17(b), and the section of the sample 103 is observed with a scanning electron microscopy (SEM) and photographed, whereby the thickness of the epitaxial layer is determined.

In the conventional evaluation method, however, the cleaving of the wafer takes much time and labor. In addition, since the evaluation is performed after the growth of the epitaxial layer, a feedback control cannot be applied during the epitaxial growth, so that the controllability of the thickness is poor, resulting in a poor production yield.

FIG. 18 is a schematic diagram illustrating a crystal growth monitor apparatus for optically measuring thickness of an epitaxial layer grown on a semiconductor substrate by molecular beam epitaxy (MBE). This apparatus is disclosed in Japanese Published Patent Application No. Hei. 2-252694.

In FIG. 18, an ultra-high vacuum container 111 having an observation window 112 contains a substrate holder 113 on which a substrate 114 is disposed. In the ultra-high vacuum container a, molecular or atomic beam of materials, which is produced by evaporating material sources 115 and 116, reaches the substrate 114, whereby a crystal is grown on the substrate. Reference numeral 117 designates a light source, numeral 119 designates a half mirror for separating reflected light from the substrate 114, numeral 120 designates a condenser lens, numeral 121 designates a diaphragm, and numeral 123 designates an eyepiece. Light 118 emitted from the light source 117 travels through the half mirror 119, the condenser lens 120, the diaphragm 121, and the observation window 112 and reaches the surface of the crystal layer growing on the substrate. The light is reflected at the surface of the growing crystal layer and received by the half mirror 122. The half mirror 122 is observed with the eyepiece 123 to see if the light strikes the proper position on the surface of the substrate. The optical path is adjusted if necessary. On the other hand, the light reflected at the surface of the growing crystal layer is reflected by the half mirror 119. The reflected light 124 is received by a spectroscope 125 and turned into monochromatic light. This monochromatic light is guided through a condenser lens 126 to a Rochon prism 127. In the Rochon prism 127, the monochromatic light is divided into two beams having different polarization planes that are at right angles to each other. These two light beams are respectively received by PIN photodiodes 128 and 129 having similar characteristics. These photodiodes 128 and 129 are connected in series and in reverse polarity, and the difference output is amplified by a DC amplifier 130 and recorded in a recorder 131.

Polarized light caused by reflection at the surface of the growing crystal layer varies according to the crystal growth condition. For example, in GaAs growth, polarized light attains a maximum when an atomic plane of Ga is formed. Thereafter, the polarized light gradually decreases as As molecules are accumulated on the atomic plane and, finally, becomes a minimum. When an As atomic plane is again formed, the polarized light becomes the maximum again. Therefore, if orthogonal polarization components are taken out and a difference between them is measured, the growth process at the surface of the substrate is directly observed.

FIG. 19 illustrates the result of observation of a growing GaAs crystal using the crystal growth monitor apparatus shown in FIG. 18, in which the abscissa shows the growth time and the ordinate shows the output from the DC amplifier 130. This output corresponds to a difference in intensities of the orthogonal polarization components. In addition, the output from the DC amplifier 130 shows a damped oscillation, and a period of this damped oscillation corresponds to the growth of one atomic layer. Therefore, the thickness of the growing crystal layer can be determined by counting the periods.

In the prior art crystal growth monitor apparatus, however, since the thickness of the growing crystal layer is measured by detecting the variation in the reflected light due to the atomic layer level unevenness at the surface of the crystal layer, the variation in the output signal is very small, resulting in difficulty in the measurement. In addition, in order to increase the S/N ratio, means for polarizing the incident light is required, whereby the monitor apparatus is complicated and rises in price.

FIGS. 20(a) and 20(b) are perspective views for explaining a prior art method for evaluating an AlGaAs multiple quantum well (hereinafter referred to as MQW) layer. In these figures, reference numeral 201 designates a GaAs substrate. A first $Al_{0.4}Ga_{0.6}As$ layer 202 is disposed on the GaAs substrate 201. An MQW layer 203 comprising alternating $Al_{0.1}Ga_{0.9}As$ well layers and $Al_{0.3}Ga_{0.7}As$ barrier layers is disposed on the first $Al_{0.4}Ga_{0.6}As$ layer 202. A second $Al_{0.4}Ga_{0.6}As$ layer 204 is disposed on the MQW layer 203.

A description is given of the evaluation process.

Initially, as illustrated in FIG. 20(a), there are successively grown on the 2-inch diameter GaAs substrate 201 the first $Al_{0.4}Ga_{0.6}As$ layer 202, the MQW layer 203 comprising alternating $Al_{0.1}Ga_{0.9}As$ well layers and $Al_{0.3}Ga_{0.7}As$ barrier layers, and the second $Al_{0.4}Ga_{0.6}As$ layer 204, preferably by MOCVD. The thicknesses of these layers are controlled by the growth time according to the growth rate which is controlled by the quantity of the supplied source gas. Thereafter, as illustrated in FIG. 20(b), the wafer is cleaved to make a strip sample 205, and the section of the sample 205 is observed with an SEM and photographed, whereby the thicknesses of the respective layers are evaluated. Further, the Al compositions of the respective layers are evaluated by peak wavelengths obtained in a PL (photoluminescence) evaluation at room temperature.

In the above-described evaluation process of the thickness of the AlGaAs MQW layer, however, the cleaving of the wafer takes much time and labor. In addition, sufficient precision to detect an error of several nanometer cannot be achieved. In evaluation of Al composition, the PL peak wavelength varies due to variations in the thickness and the Al composition, and the variation in the Al composition cannot be separated from the variation in the thickness. Therefore, an accurate evaluation of the Al composition is impossible.

SUMMARY OF THE INVENTION

It is an object of the present invention to provide a relatively simple method for evaluating epitaxial layers during the epitaxial growth process.

It is another object of the present invention to provide a test pattern for process evaluation that achieves a precise evaluation of epitaxial layers grown on a substrate.

It is still another object of the present invention to provide a method for evaluating thickness and Al composition of an AlGaAs MQW layer with high precision, without cleaving a wafer.

Other objects and advantages of the present invention will become apparent from the detailed description give hereinafter; it should be understood, however, that the detailed description and specific embodiment are given by way of illustration only, since various changes and modifications within the scope of the invention will become apparent to those skilled in the art from this detailed description.

According to a first aspect of the present invention, in a method for evaluating a semiconductor layer epitaxially growing on a substrate, a plurality of stripe-shaped ridges extending in a prescribed direction are formed on the substrate, and a semiconductor layer is grown on the substrate including the stripe-shaped ridges while irradiating the stripe-shaped ridges with light and monitoring diffracted light from the stripe-shaped ridges, whereby the thickness of the epitaxially grown semiconductor layer is evaluated. Therefore, the thickness of the epitaxial layer is easily evaluated during the epitaxial growth process, whereby the thickness controllability is significantly improved.

According to a second aspect of the present invention, a test pattern comprises a plurality of stripe-shaped ridges formed on a part of a substrate and in a prescribed direction selected so that a semiconductor layer having a triangular section and side surfaces on which the epitaxial growth does not proceed is grown on each of the stripe-shaped ridges. Each ridge has a width W and a height H that satisfy a relation of d≈0.7 W+H where d is a desired thickness of the semiconductor layer epitaxially grown on the substrate. Since the test pattern comprising the stripe-shaped ridges is flat when the epitaxially growing layer reaches the desired thickness, the thickness of the epitaxially growing layer is evaluated with high precision.

According to a third aspect of the present invention, in a method for evaluating an epitaxially grown AlGaAs multiple quantum well layer, initially, an insulating mask pattern having an opening is formed on a part of a substrate on which a plurality of semiconductor layers including the AlGaAs multiple quantum well layer are to be grown. The ratio of the width of the opening to the width of the insulating mask pattern is varied continuously or in steps. Then, a plurality of semiconductor layers including the AlGaAs multiple quantum well layer are grown on the substrate including the insulating mask pattern using a vapor phase growth method. Thereafter, PL peak wavelengths of the AlGaAs multiple quantum well layer grown in the opening of the insulating mask pattern are measured at different positions with different opening ratios of the insulating mask pattern, and the measured values are compared with theoretical curves obtained with respect to a standard quantum well structure, whereby the thickness and the Al composition of the AlGaAs multiple quantum well layer are evaluated. The PL peak wavelengths vary in response to variations in thickness and Al composition, and the variation in the PL peak wavelengths at the different positions of the opening of the insulating mask pattern due to the variation in the thickness is different from that due to the variation in the Al composition ratio, so that the thickness and the Al composition ratio of the AlGaAs multiple quantum well layer are evaluated with high precision, without cleaving the wafer.

BRIEF DESCRIPTION OF THE DRAWINGS

FIG. 12 is an enlarged view of the test pattern shown in

FIG. 11.

DETAILED DESCRIPTION OF THE PREFERRED EMBODIMENTS

Figure 1:
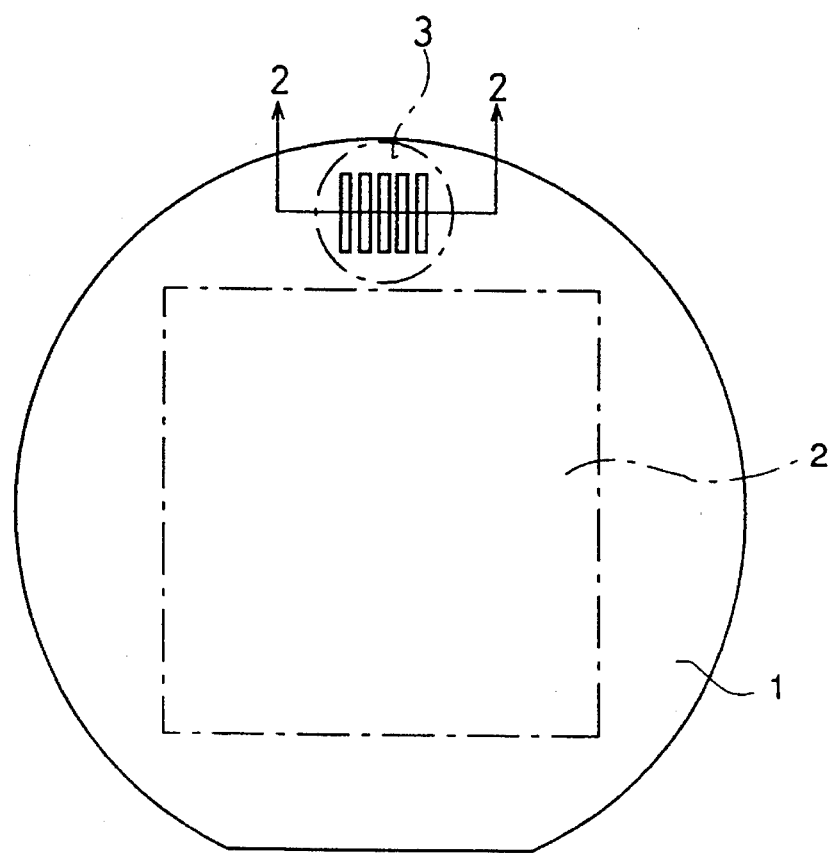
FIG. 1 is a plan view of a substrate including a test pattern for process evaluation used for evaluating an epitaxial layer growing on the substrate, in accordance with a first embodiment of the present invention.
Figure 2:
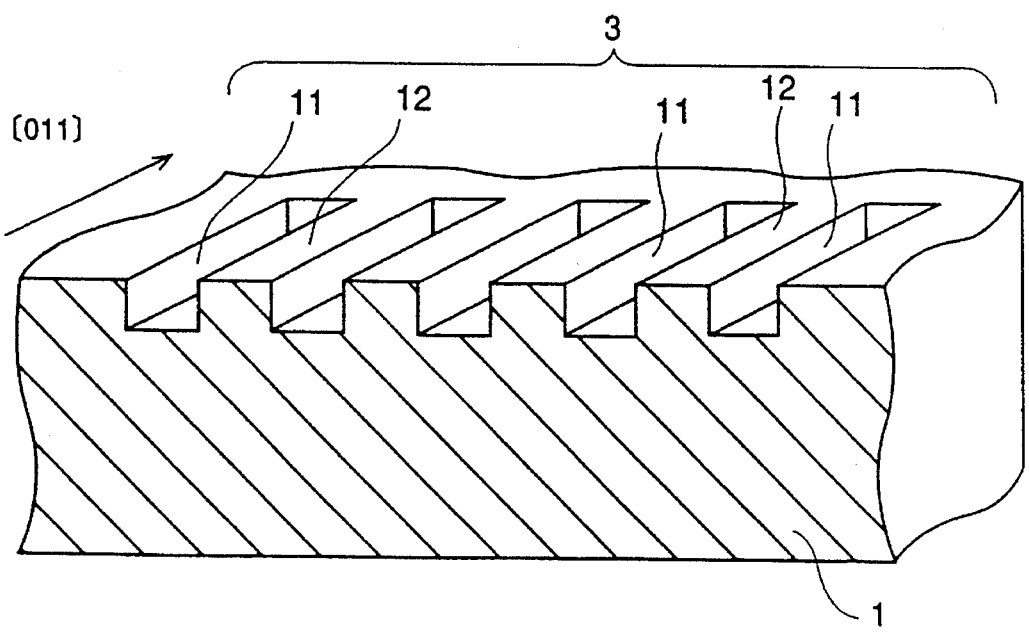
FIG. 2 is a sectional view taken along a line 2—2 of FIG. 1.

FIG. 1 is a plan view of a substrate including a test pattern used for evaluating an epitaxial layer grown on the substrate, in accordance with a first embodiment of the present invention. In FIG. 1, reference numeral 1 designates a GaAs substrate with a (100) surface orientation. The GaAs substrate 1 includes a region 2 where semiconductor elements are to be produced (hereinafter referred to as element region) and a test pattern 3 for process evaluation (hereinafter referred to as TEG (Test Element Group)) disposed outside the element region 2. FIG. 2 is a sectional view taken along a line 2—2 of FIG. 1. As shown in FIG. 2, the TEG 3 is a periodic pattern of stripe-shaped grooves 11 extending in the [011] direction. Reference numeral 12 designates stripe-shaped ridge portions of the GaAs substrate 1 produced between the grooves 11.

Figure 3:
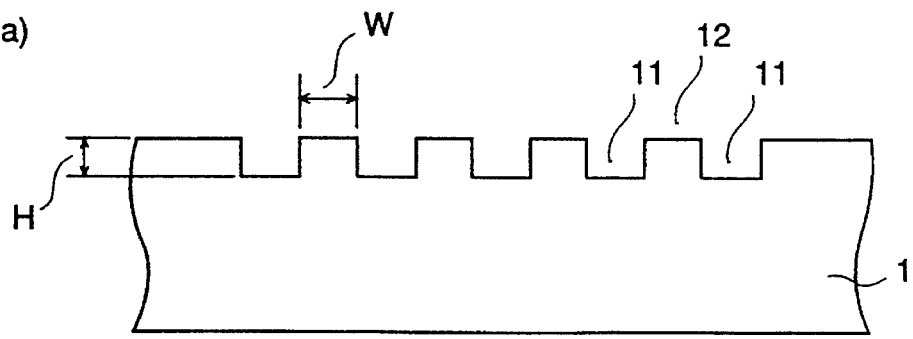
FIGS. 3(a)–3(c) are sectional views for explaining the evaluation method according to the first embodiment of the present invention.
Figure 3:
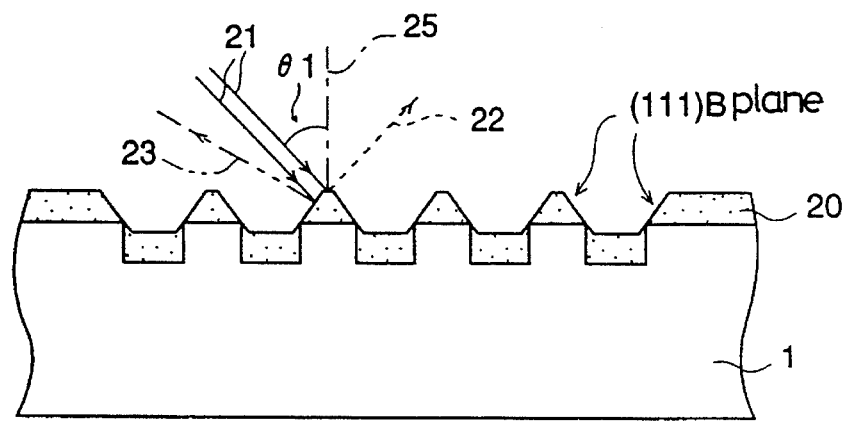
Figure 3:
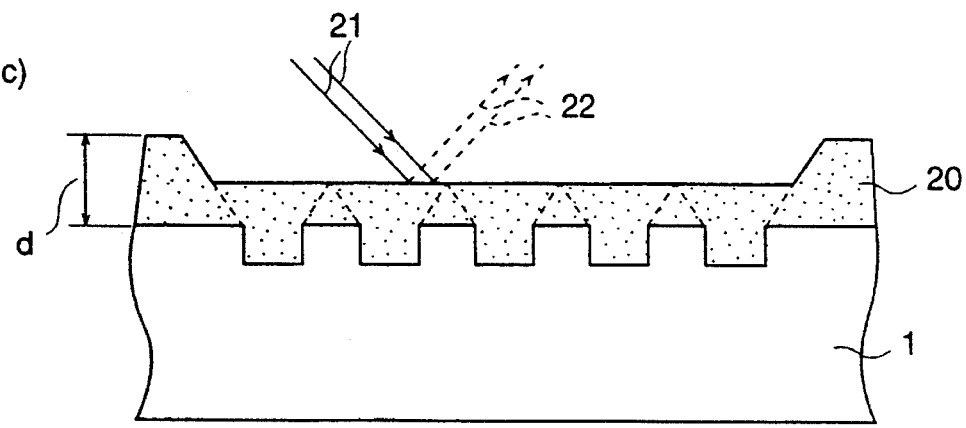

FIGS. 3(a)–3(c) are sectional views taken along the line 2—2 of FIG. 1 for explaining a method for evaluating an epitaxial layer growing on the substrate, according to the first embodiment of the present invention. In this first embodiment, a GaAs layer 20 is epitaxially grown on the GaAs substrate 1. Reference numeral 21 designates light incident on the TEG comprising the alternating stripe-shaped grooves 11 and ridges 12. Reference numeral 22 designates diffracted light produced by reflection type diffraction of the incident light 21 at a flat portion of the TEG. Reference numeral 23 designates diffracted light produced by reflection type diffraction of the incident light 21 at a (111)B plane that is formed during the crystal growth on the TEG. Reference numeral 25 designates a normal, perpendicular to the surface of the substrate 1.

A description is given of the evaluation method.

Initially, as illustrated in FIG. 3(a), a periodic pattern of stripe-shaped grooves 11 extending in the [011] direction is formed on the (100) surface of the GaAs substrate 1 using photolithography and dry etching, whereby a TEG comprising these stripe-shaped grooves 11 and a plurality of stripe-shaped ridges 12 between these grooves 11 is produced. The width (W) and the height (H) of the ridge 12 are adjusted so that the TEG is completely buried by an epitaxially grown layer 20 with a flat surface when the layer 20 attains a desired thickness d.

In the step of FIG. 3(b), a GaAs epitaxial layer 20 is grown on the GaAs substrate 1 by MOCVD. On the stripe-shaped ridge 12 extending in the [011] direction, the crystal growth proceeds forming (111)B planes on which no crystal grows. In this first embodiment, during the crystal growth process, the TEG is irradiated with light 21, such as laser light, and either or both of the diffracted lights 22 and 23 is/are monitored. The incident light 21 is applied to the TEG in a direction perpendicular to the stripe direction of the TEG, at an incident angle $\theta_1$ with respect to the normal 25 perpendicular to the surface of the substrate 1. The epitaxial growth is stopped when the stripe-shaped ridges 12 of the TEG are completely buried and the surface of the grown layer 20 becomes flat as shown in FIG. 3(c), whereby the desired thickness d is obtained.

A description is given of the principle of the above-described evaluation method. FIGS. 4(a)–4(c) and 5(a)–5(b) are diagrams illustrating reflections of incident light on the TEG at different steps in the epitaxial growth process. FIG. 6 is a graph illustrating growth time (T) vs. diffracted light intensity (R) characteristics. In FIG. 6, a curve A shows a change of the intensity of the diffracted light 22, and a curve B shows a change of the intensity of the diffracted light 23.

FIG. 4(a) illustrates reflection of incident light 21 from the surface of the TEG before the epitaxial growth, i.e., at the growth time T=0 of FIG. 6. The TEG formed on the GaAs substrate 1 is a reflection type diffraction grating. In FIG. 4(a), assuming that the width of the ridge 12 is W, the width of the groove 11 is D, and the diffraction angle is $\theta_2$, the diffraction condition of the incident light 21 at the incident angle $\theta_1$ is represented by $$(D+W) \cdot (\sin \theta_1 + \sin \theta_2) = m\lambda$$

where m is the order of the diffraction.

Therefore, a main peak (m=0) of the diffracted light 22 is observed in a direction of diffraction angle $\theta_2 = -\theta_1$. The incident angle $\theta_1$ is selected to satisfy the relation $$|\theta_1| \leq \tan^{-1}(2H/D)$$

so that a high-order component due to multiple reflection at the side surface of the stripe-shaped ridge 12 is quenched.

In addition, the diffracted light intensity R1 of the main peak is given by $$R1 \sim R0 \, W/(D+W)$$

where R0 is the reflected light intensity at the flat surface.

FIG. 4(b) illustrates reflection of incident light 21 on the surface of the TEG during the epitaxial growth, at the growth time T1 of FIG. 6. Since the GaAs epitaxial layer 20 does not grow on the (111)B plane, the growth proceeds forming a trapezoid portion on each stripe-shaped ridge 12 of the TEG as shown in FIG. 4(b). The incident light 21 is diffracted at the inclined plane of the trapezoid portion, i.e., the (111)B plane (diffracted light 23). The incident angle $\phi_1$ on the inclined plane and the diffraction angle $\phi_2$ of the main peak have the relation of $\phi2=-\phi1$. Therefore, assuming that the inclination of the inclined plane of the trapezoid portion is $\chi$, the diffracted light 23 is observed in a direction of $\theta3=2\chi-\theta1$.

Figure 4:
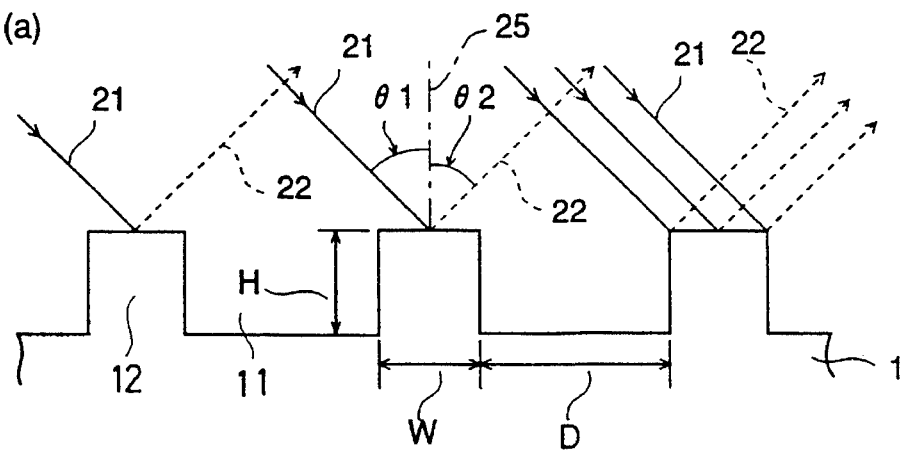
FIGS. 4(a)–4(c) and 5(a)–5(b) are sectional views for explaining reflections of incident light from the surface of the test pattern at different steps in the epitaxial growth process, in accordance with the first embodiment of the present invention.
Figure 4:
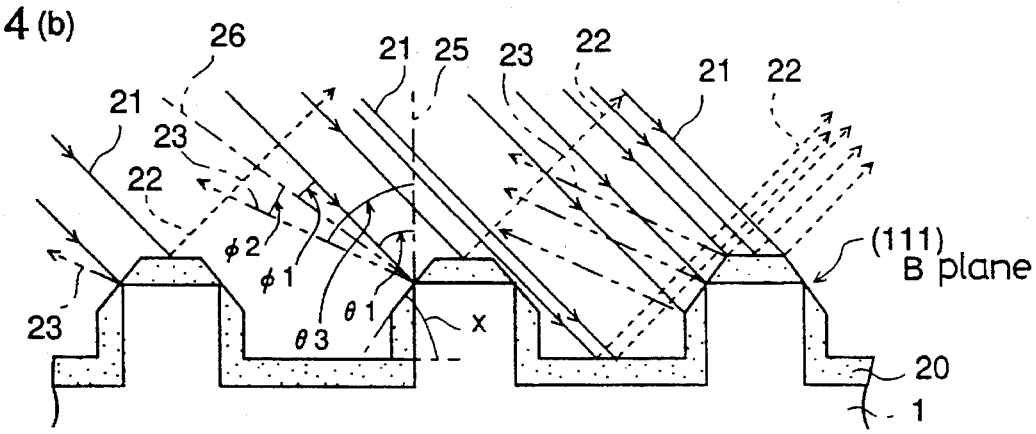
Figure 4:
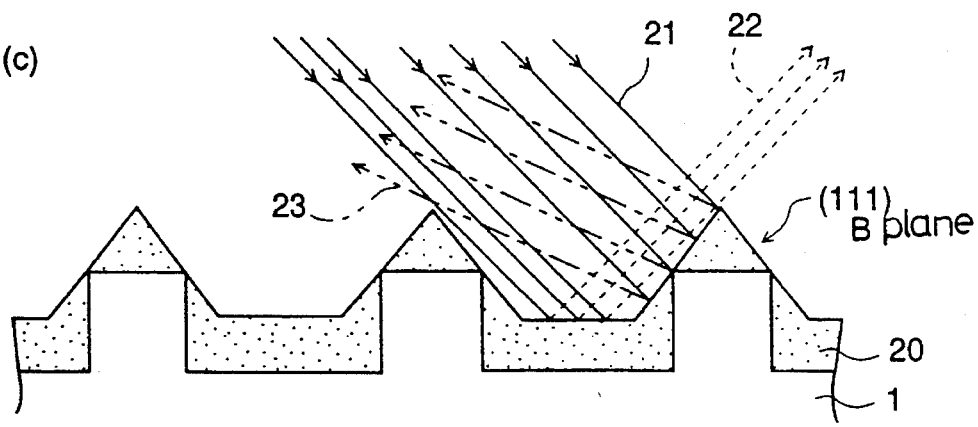

FIG. 4(*c*) illustrates reflection of incident light 21 on the TEG during the epitaxial growth, at the growth time T2 of FIG. 6. The epitaxial growth on the stripe-shaped ridge 12 of the TEG stops when a triangular cross-section is formed as shown in FIG. 4(*c*). When the triangular cross-section is formed, the intensity of the diffracted light 23 in the direction of $\theta3=2\chi-\theta1$ becomes a maximum. Since the inclination $\chi$ of the inclined plane of the trapezoid portion, i.e., the inclination of the (111)B plane with respect to the (100) surface of the substrate, is about 54°, the diffracted light intensity R2 at this time in the same direction is given by $$R2=R0\ W(0.7/\tan\theta1+0.5)/(D+W)$$

In addition, the diffracted light intensity A in the $\theta2=-\theta1$ direction becomes the minimum.

Figure 5:
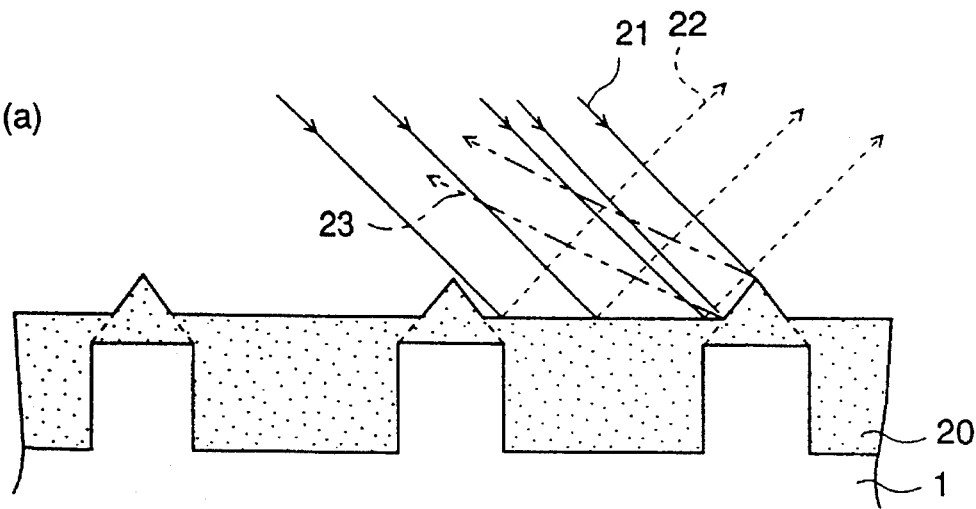
Figure 5:
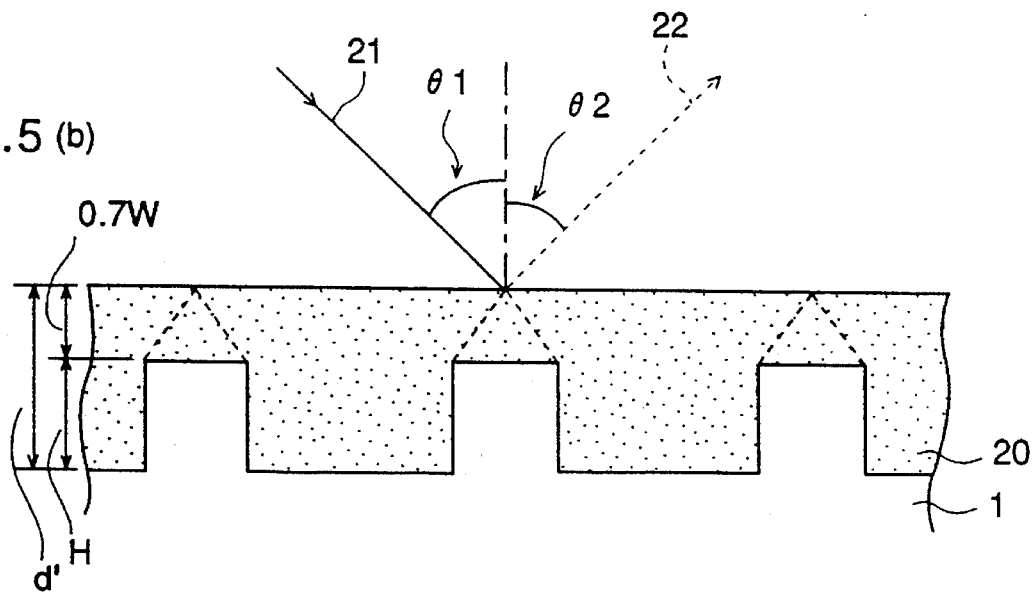
Figure 6:
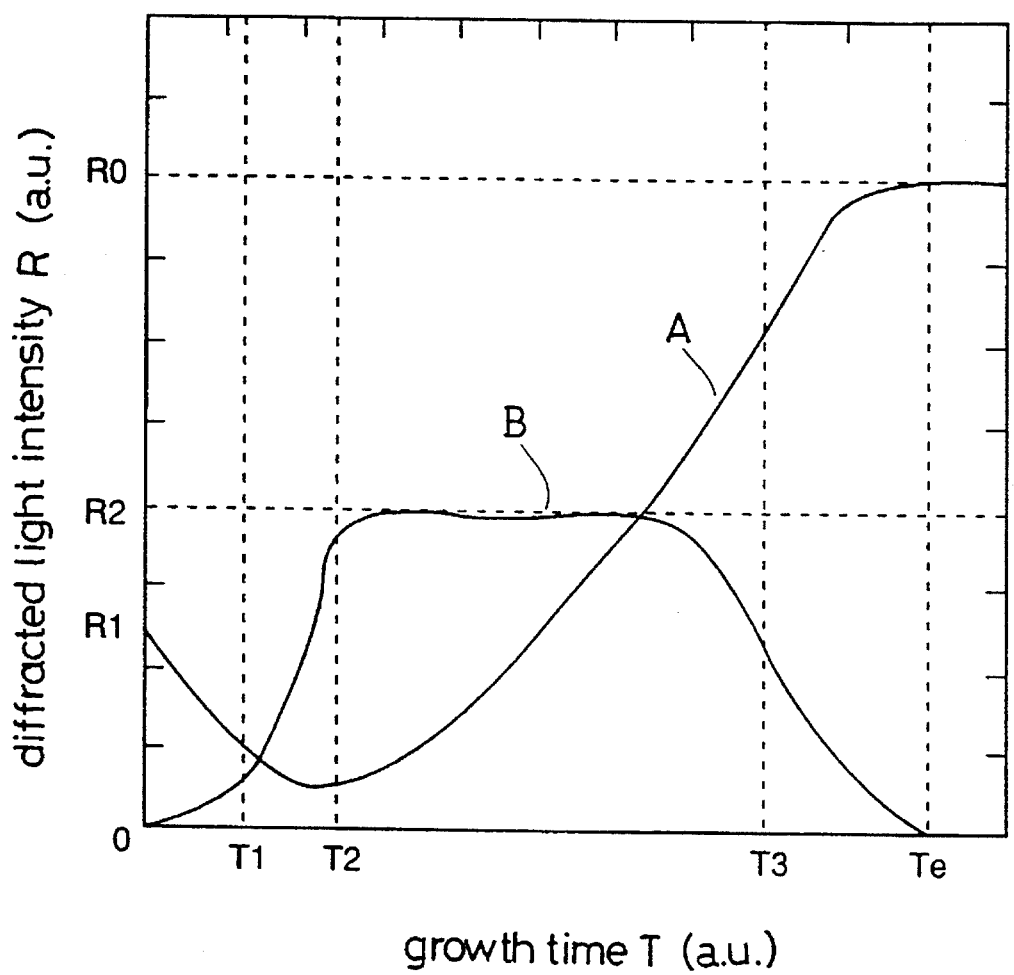
FIG. 6 is a graph illustrating growth time vs. diffracted light intensity characteristics.

FIG. 5(*a*) illustrates reflection of incident light 21 on the TEG during the epitaxial growth, at the growth time T3 of FIG. 6. As the triangular portions on the stripe-shaped ridges of the TEG are gradually embedded by the growing GaAs layer 20 as shown in FIG. 5(*a*), the diffracted light intensity A in the $\theta2$ direction increases and the diffracted light intensity B in the $\theta3$ direction decreases.

FIG. 5(*b*) shows reflection of incident light 21 on the TEG after the epitaxial growth is completed, at the growth time Te of FIG. 6. When the triangular portions on the stripe-shaped ridges of the TEG are completely embedded in the growing GaAs layer 20, i.e., when the surface of the GaAs layer 20 growing on the TEG becomes flat, the incident light 21 is reflected at the flat surface in the $\theta2=-\theta1$ direction. That is, only the diffracted light 22 remains. Accordingly, the completion of the TEG stripe embedding growth is detected by irradiating the TEG with light at an angle $\theta1$ and observing the diffracted light intensities in the $-\theta$ direction and the $2\chi-\theta$ direction.

Figure 18:
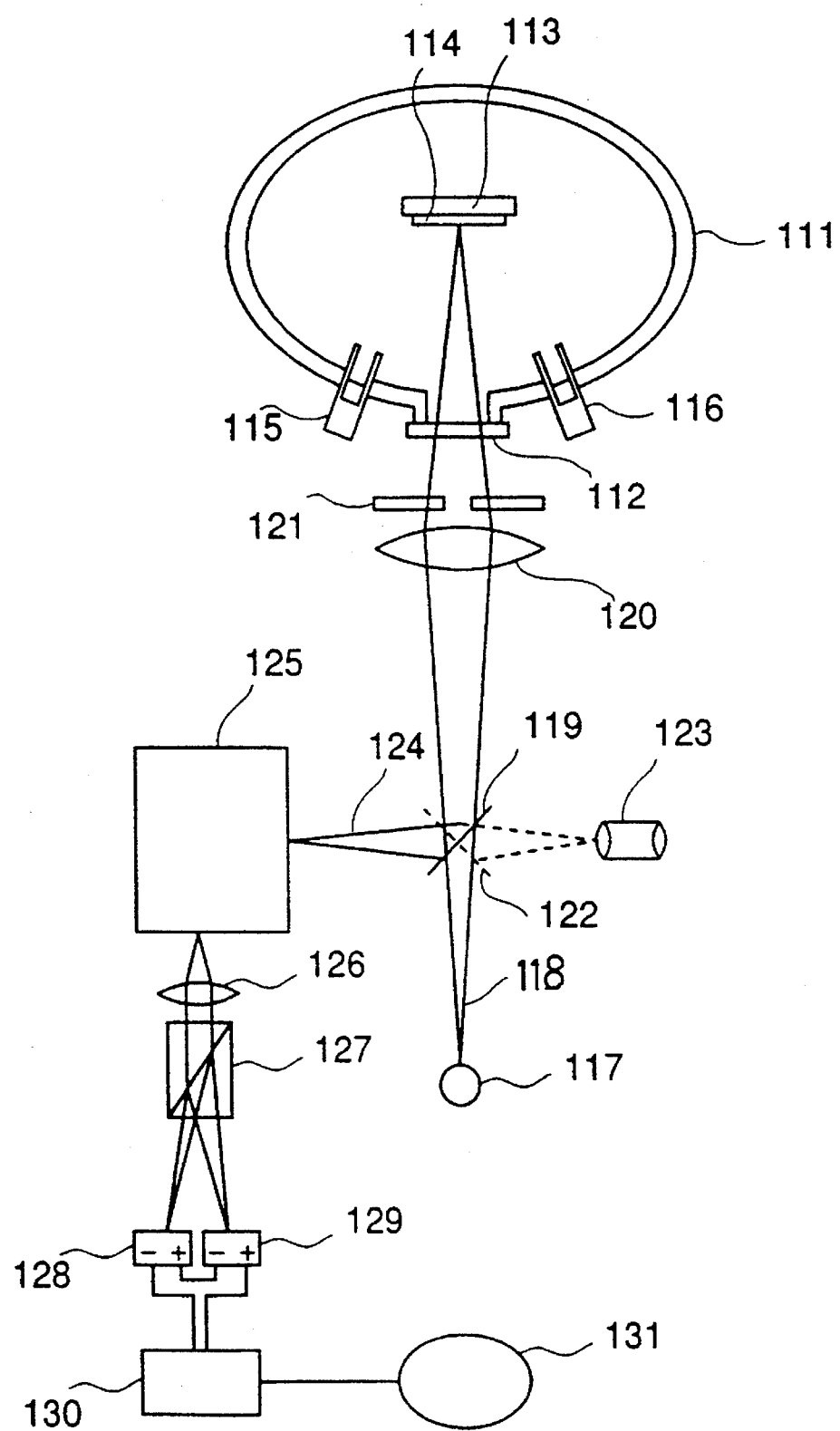
FIG. 18 is a schematic diagram illustrating a crystal growth monitor apparatus for optically measuring the thickness of an epitaxial layer grown on a semiconductor substrate by MBE according to the prior art.
Figure 19:
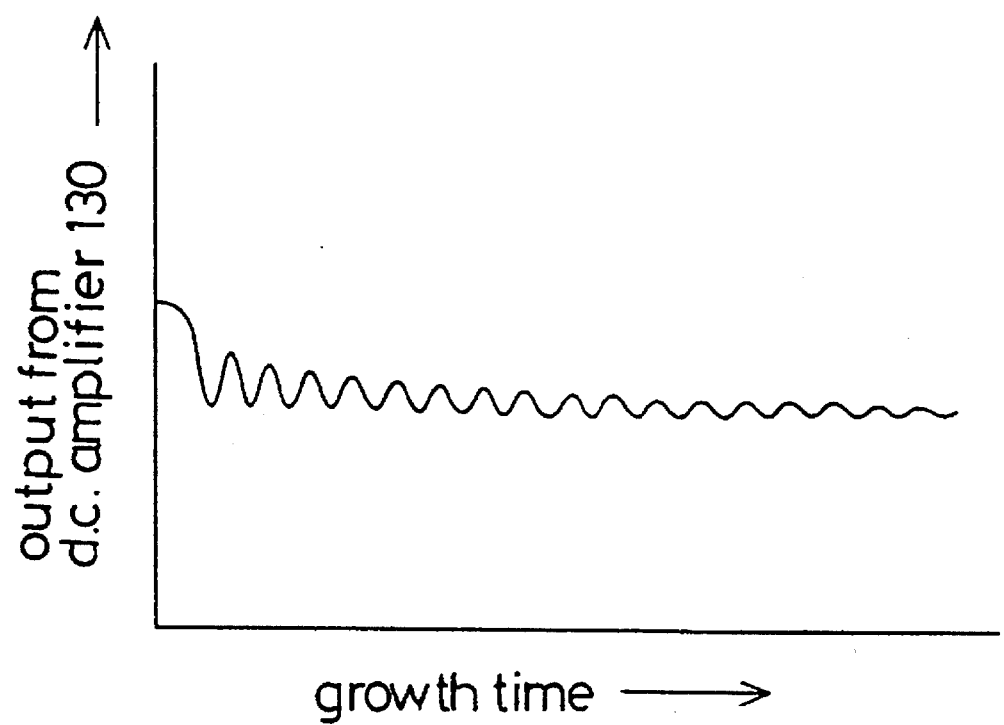
FIG. 19 is a diagram illustrating the result of observation of a growing GaAs crystal using the crystal growth monitor apparatus shown in FIG. 18.
Figure 20A:
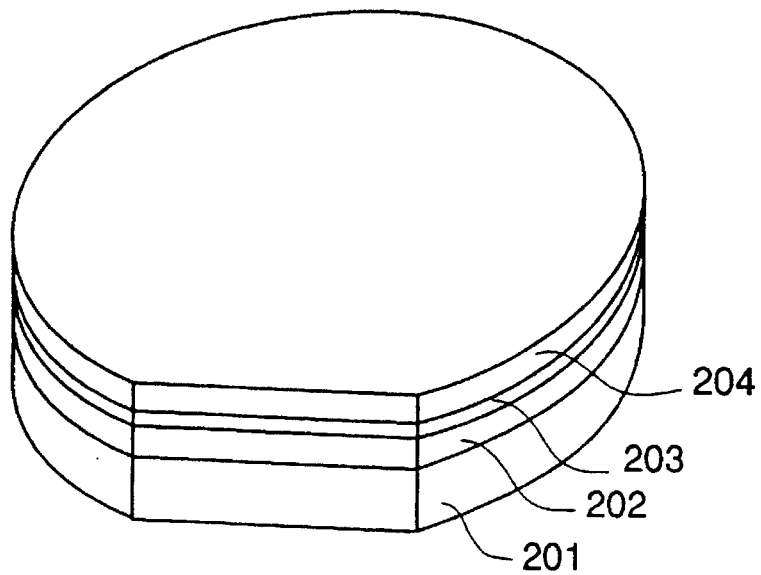
FIGS. 20(a) and 20(b) are perspective views for explaining a method for evaluating an AlGaAs MQW layer according to the prior art.
Figure 20B:
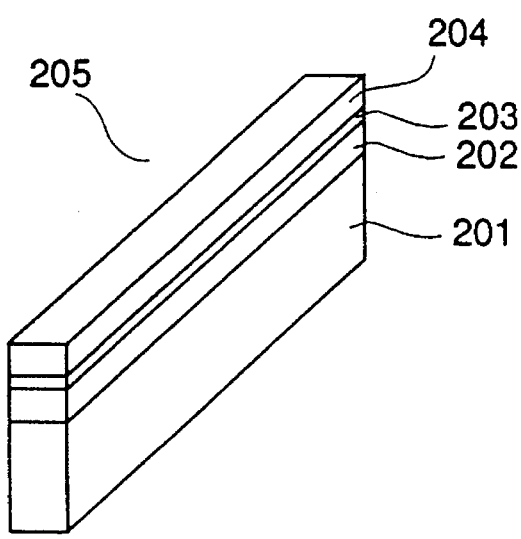

In this first embodiment of the present invention, since light diffracted from the TEG 3 having an intensity that is determined according to a desired thickness of an epitaxially grown layer is monitored, an increased signal intensity is obtained compared to the prior art method shown in FIG. 18 in which diffracted light caused by the atomic layer level unevenness is monitored. Therefore, the growth conditions of the epitaxial layer are detected with high precision, without polarizing the incident light.

A description is given of the width W and the height H of the stripe-shaped ridges 12 of the TEG 3.

As described above, the epitaxial growth on the TEG proceeds forming a triangular portion having (111)B planes on each stripe-shaped ridge of the TEG. Since the angle $\chi$ formed between the (111)B plane and the (100) surface of the substrate is about 54°, the thickness of the triangular layer grown on the ridge 12 is about 0.7 W. On the other hand, the thickness of the epitaxial layer grown on a region of the substrate 1 other than the TEG region 3 is approximately equal to the thickness of the epitaxial layer grown in the stripe-shaped groove 11 of the TEG. More specifically, the thickness d of the epitaxial layer grown on the substrate 1 other than the TEG region 3 shown in FIG. 3(*c*) is approximately equal to the thickness d' of the epitaxial layer grown in the groove 11 shown in FIG. 5(*b*). The thickness d' is represented by 0.7 W+H.

Accordingly, if a desired thickness of the epitaxial layer is d, the width W and the height H of the stripe-shaped ridge 12 are selected so that the relation of d=0.7 W+H is satisfied, whereby an epitaxial layer with the desired thickness d is grown on the substrate other than the TEG region at the moment when the TEG region is flatly embedded.

As described above, according to the first embodiment of the present invention, the TEG 3 including a plurality of stripe-shaped ridges 12 extending in a prescribed direction is formed on the substrate. The TEG is irradiated with light in a prescribed direction during the epitaxial growth on the substrate, and light diffracted by the TEG is monitored. Therefore, the thickness of the epitaxial layer is evaluated with high precision, without cleaving the substrate.

Figure 21:
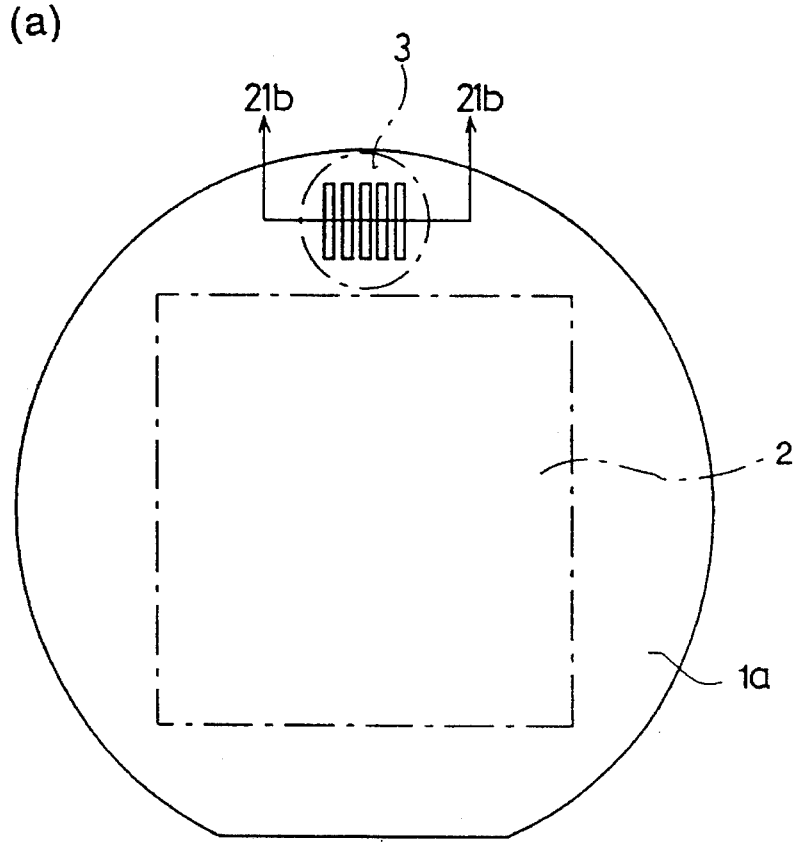
FIGS. 21(a) and 21(b) are a plan view and a sectional view illustrating a modification of the first embodiment of the present invention.
Figure 21B:
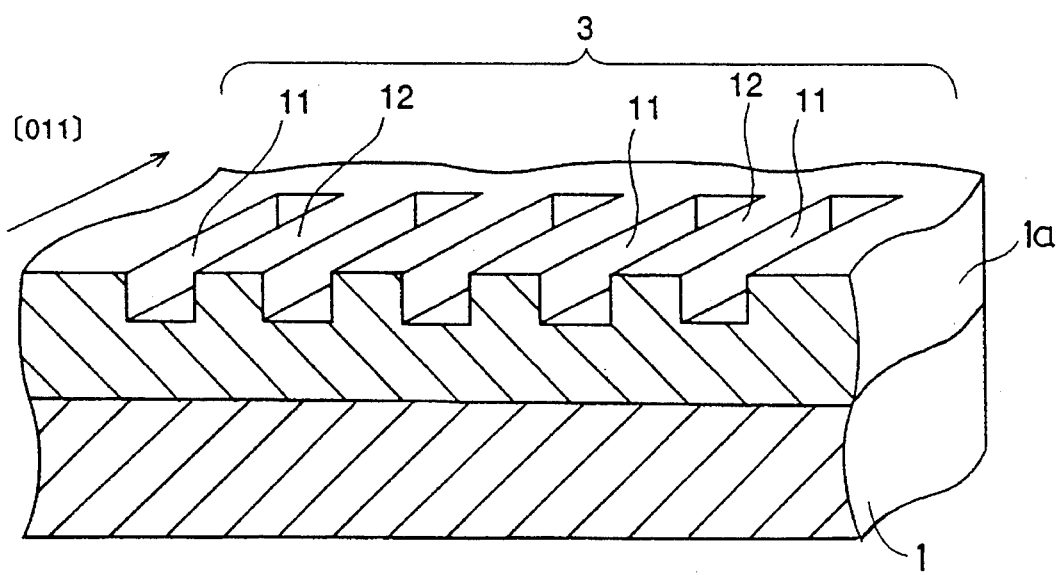

While in the above-described first embodiment the TEG 3 is formed directly on the surface of the GaAs substrate 1, it may be formed on a semiconductor layer 1*a* disposed on the substrate 1, as illustrated in FIGS. 21(*a*)–21(*b*).

While in the above-described first embodiment the epitaxial growth is carried out by MOCVD, the present invention may be applied to epitaxial growths employing other vapor phase growth methods, such as MBE (Molecular Beam Epitaxy) or CBE (Chemical Beam Epitaxy).

Further, while in the above-described first embodiment the stripe-shaped ridges 12 of the TEG 3 are formed in a rectangular shape by dry etching, these ridges may be formed in reverse-mesa shape using wet etching. Also in this case, the same effects as described above are achieved.

Figure 7:
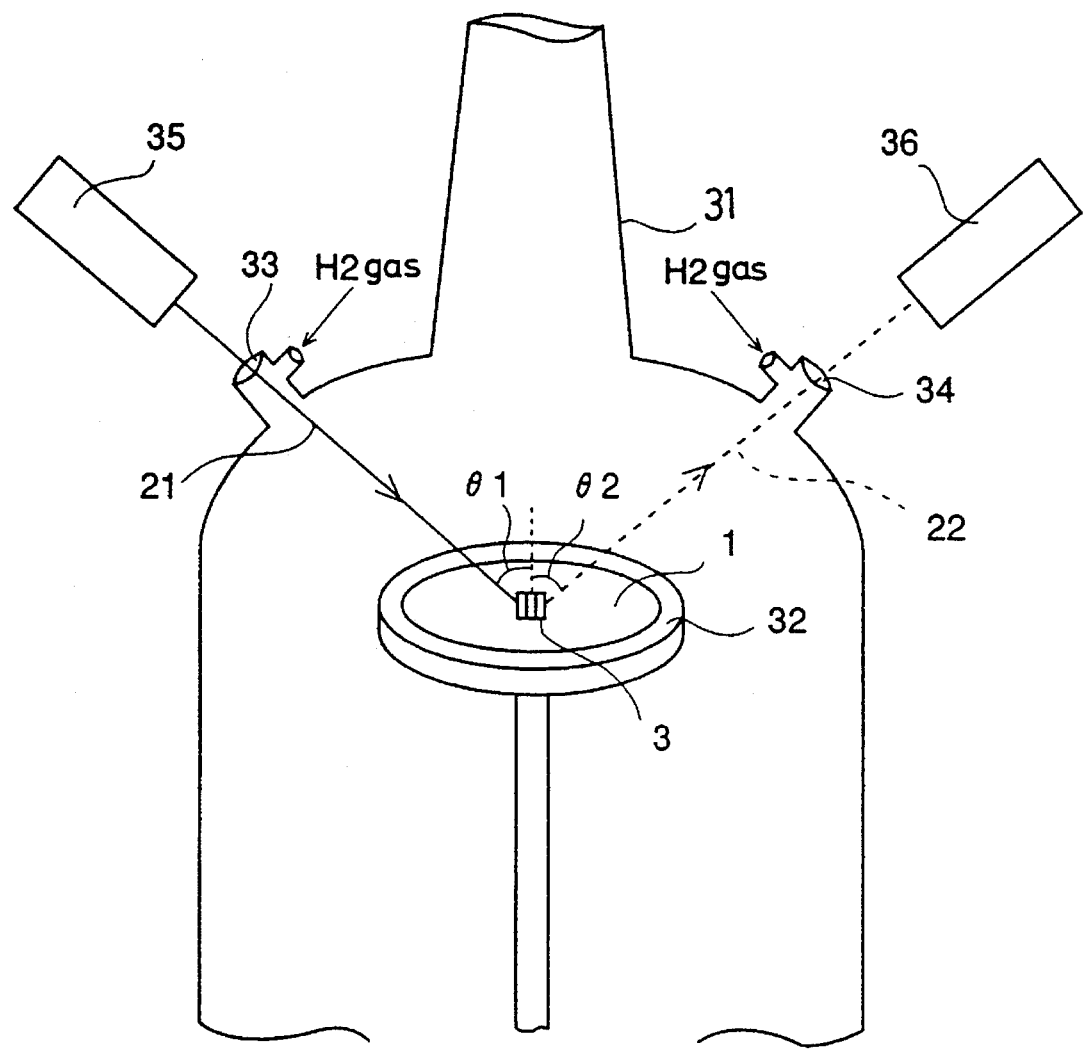
FIG. 7 is a schematic diagram illustrating an epitaxial growth apparatus employed for the epitaxial layer evaluation method according to the first embodiment of the present invention.

FIG. 7 is a schematic diagram illustrating an epitaxial growth apparatus employed for the above-described evaluation process according to the first embodiment of the present invention. In FIG. 7, reference numeral 31 designates a reaction furnace containing a substrate holder 32. The GaAs substrate 1 including the TEG 3 shown in FIG. 1 is disposed on the substrate holder 32. Incident light 21 is introduced into the furnace 31 through an entrance window 33. The incident light 21 is diffracted by the TEG 3 on the substrate 1. The diffracted light 22 is taken out of the furnace from an exit window 34. Reference numeral 35 designates a laser light source and reference numeral 36 designates a photodetector. The TEG 3 on the substrate 1, the entrance window 33, and the exit window 34 are arranged so that the incident angle $\theta1$ of the incident light 21 and the diffraction angle $\theta2$ of the diffracted light 22 have the relation of $\theta2=-\theta1$ and the incident light 21 is perpendicular to the stripe direction of the TEG 3. In a case where the GaAs substrate 1 is rotated during the epitaxial growth process, the rotation of the GaAs substrate 1 should be synchronized with the switching of the incident light 21 so that the evaluation is carried out only at the moment when the incident light 21 is perpendicular to the stripe direction of the TEG 3. Further, the entrance window 33 and the exit window 34 must be flat so that the incident light 21 and the diffracted light 22 are not broadened. Alternatively, those windows 33 and 34 may be convex lenses that condense the incident light 21 and the diffracted light 22, respectively. During the epitaxial growth, a carrier gas, such as H$_2$, flows in the furnace to prevent the inner wall of the furnace from being clouded.

Using the above-described epitaxial growth apparatus, the diffracted light 22 from the TEG 3 is monitored during the epitaxial growth process, and the thickness of the epitaxially growing layer is evaluated with high precision, whereby production yield of semiconductor devices is improved.

In the apparatus shown in FIG. 7, only the diffracted light 22 in the $\theta2$ direction, i.e., diffracted light at the flat surface of the TEG 3, is monitored through the exit window 34. However, the exit window may be positioned so that the diffracted light 23 in the $\theta3$ direction, i.e., diffracted light at the sloping surface of the TEG 3, is monitored. Alternatively, two exit windows may be provided so that both of the diffracted light beam 22 and 23 are monitored.

A description is given of a second embodiment of the present invention in which the above-described evaluation method is applied to an epitaxial growth process in a production of a semiconductor laser.

Figure 8:
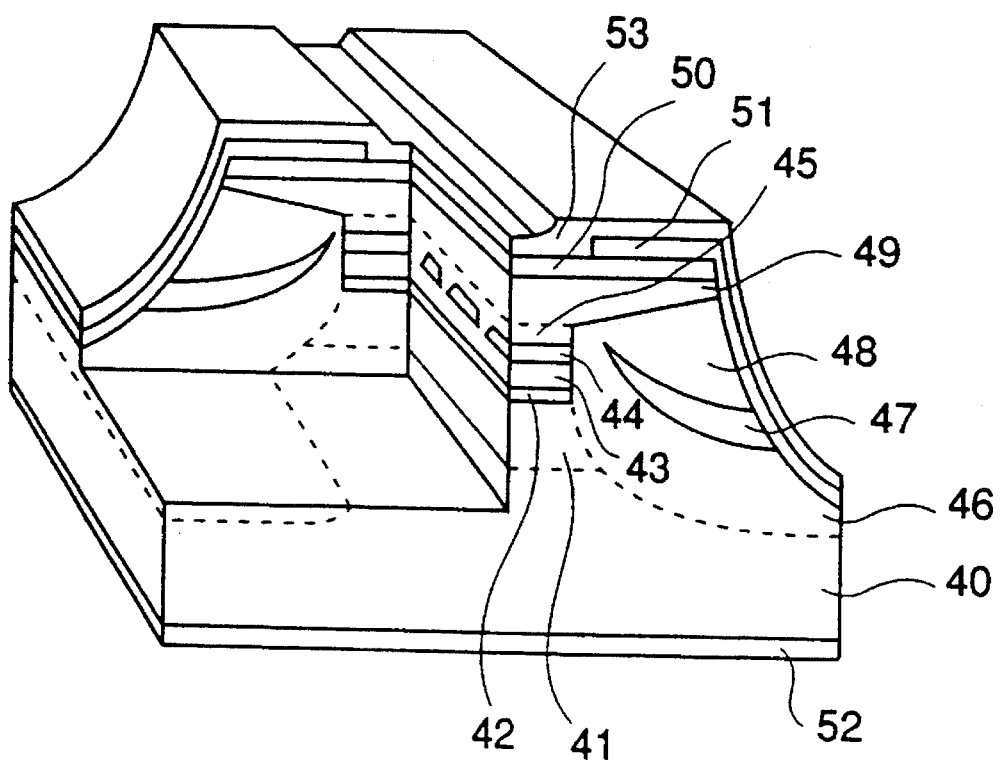
FIG. 8 is a perspective view, partially in section, illustrating an InP semiconductor laser including a diffraction grating.

FIG. 8 is a perspective view, partially in section, illustrating an InP semiconductor laser having a diffraction grating. In the figure, reference numeral 40 designates a p type InP substrate having a (100) surface orientation. A p type InP lower cladding layer 41 is disposed on the substrate 40. An undoped InGaAsP active layer 42 is disposed on the lower cladding layer 41. An n type InP barrier layer 43 is disposed on the active layer 42. A plurality of stripe-shaped n type InGaAsP layers 44 producing a diffraction grating are disposed on the InP barrier layer 43. These stripe-shaped InGaAsP layers 44 are periodically arranged parallel to each other and perpendicular to the resonator length direction of the laser. A first n type InP upper cladding layer 45 is disposed on the n type InGaAsP layers 44 and on the n type InP barrier layer 43. The first upper cladding layer 45, the n type InGaAsP layers 44, the barrier layer 43, the active layer 42, and the lower cladding layer 41 are formed in a stripe-shaped mesa by etching. A p type InP layer 46 is disposed on part of the substrate 40, contacting the opposite sides of the mesa. An n type InP layer 47 is disposed on parts of the p type InP layer 46. An additional p type InP layer 48 is disposed on the n type InP layer 47 and part of the p type InP layer 46. A second n type InP upper cladding layer 49 is disposed on the p type InP layer 48 as well as on the first upper cladding layer 45. An n type InGaAsP contact layer 50 is disposed on the second upper cladding layer 49. An insulating film, such as $SiO_2$, including a window opposite the stripe-shaped mesa is disposed on the top and side surfaces of the laser structure. A p side electrode 52 is disposed on the rear surface of the substrate 40 and an n side electrode 53 is disposed on the insulating film 51, contacting the InGaAsP contact layer 50 through the window in that insulating film 51.

Figure 9:
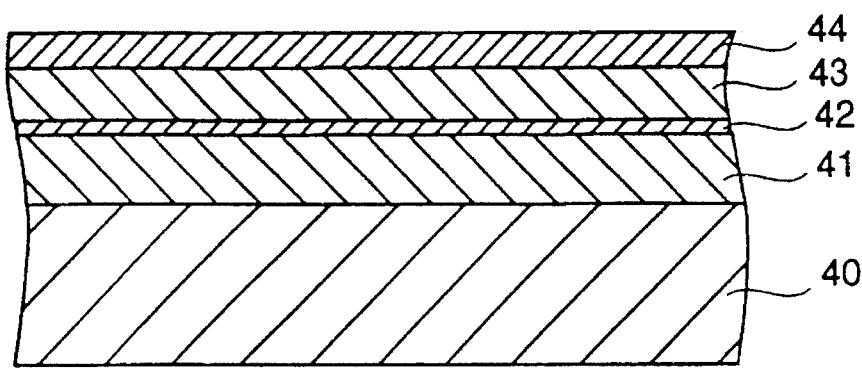
FIGS. 9(a)–9(c) are sectional views for explaining a method for evaluating an epitaxial layer in accordance with a second embodiment of the present invention, which is employed in the production of the semiconductor laser shown in FIG. 8.
Figure 9:
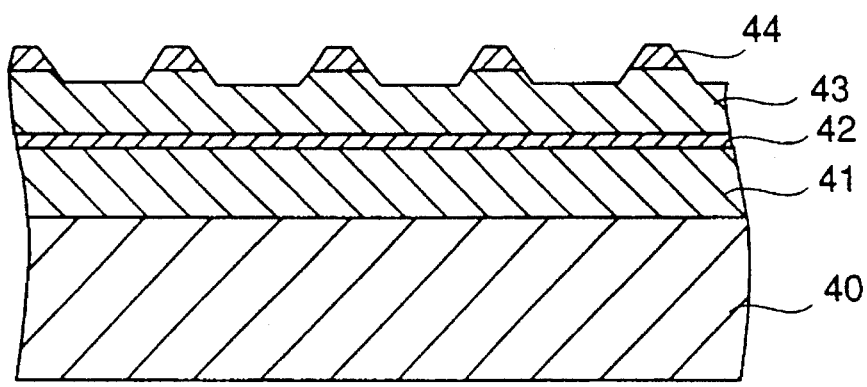
Figure 9:
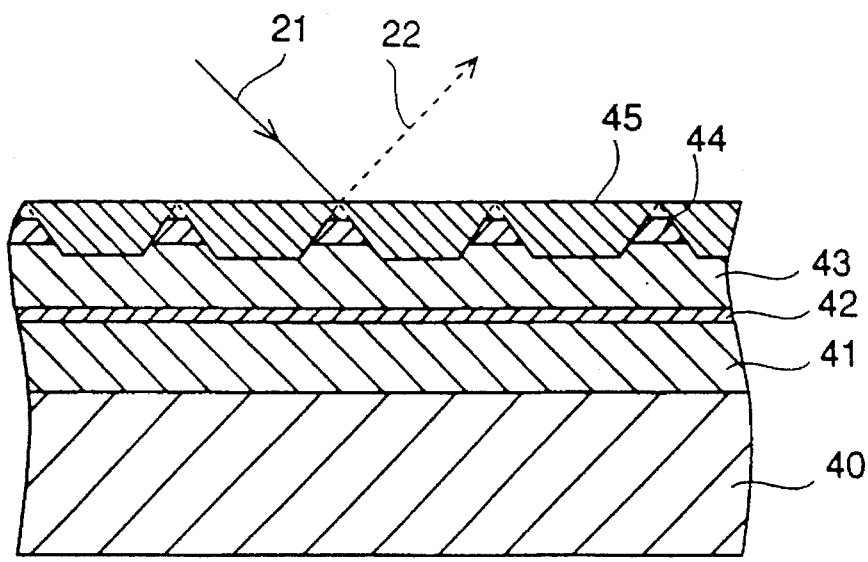

FIGS. 9(a)–9(c) are sectional views illustrating process steps in a method for evaluating an epitaxially grown layer according to the second embodiment of the present invention.

A description is given of the evaluation method. Initially, as illustrated in FIG. 9(a), the p type InP cladding layer 41, the undoped InGaAsP active layer 42, the n type InP barrier layer 43, and the n type InGaAsP layer 44 are successively grown on the (100) surface of the p type InP substrate 40. Thereafter, a mask pattern for selective etching is formed on the n type InGaAsP layer 44 using photolithographic techniques, and the n type InGaAsP layer 44 is patterned in a plurality of stripe-shaped ridges which are periodically arranged parallel to each other and perpendicular to what becomes the resonator length direction of the laser, preferably by wet etching using HBr as an etchant, whereby a diffraction grating is produced. If the stripe-shaped ridges of the n type InGaAsP layer 44 are formed in the [011] direction, each ridge has a trapezoid section as shown in FIG. 9(b).

Thereafter, the n type InP cladding layer 45 is grown on the n type InP barrier layer 43 and on the diffraction grating 44, preferably by MOCVD. During the MOCVD growth, the diffraction grating 44 is irradiated with light 21, such as laser light, and diffracted light 22 is monitored, whereby the moment when the diffraction grating 44 is completely embedded by the n type InP cladding layer 45 as shown in FIG. 9(c) is detected. The incident light 21 is applied perpendicular to the stripe direction of the diffraction grating 44.

In the above-described production process of the semiconductor laser, when the first n type InP upper cladding layer 45 is grown on the diffraction grating comprising the stripe-shaped InGaAsP layers 44 by vapor phase deposition, the diffraction grating unfavorably loses its initial shape due to mass transport in the InGaAsP layers, whereby the thickness and amplitude of the diffraction grating are reduced, resulting in difficulty in controlling the coupling coefficient that connects the intensity of distributed feedback applied to light. The unwanted mass transport is suppressed by decreasing the growth temperature of the first n type InP upper cladding layer 45. However, since low temperature growth does not provide a high-quality crystalline layer, it is not desired that the entire first upper cladding layer 45 be formed at a low temperature.

Employing the evaluation method according to this second embodiment of the present invention, the moment when the diffraction grating comprising the stripe-shaped n type InGaAsP layers 44 is completely embedded is easily detected. Therefore, the first n type InP upper cladding layer 45 is grown at a relatively low temperature until this moment and, thereafter, it is grown at a relatively high temperature, whereby mass transport is suppressed and the crystal quality of the first upper cladding layer 45 is improved.

As described above, according to the second embodiment of the present invention, the n type InGaAsP layer 44 is patterned in a plurality of stripe-shaped parallel ridges to form a diffraction grating, and the first n type InP upper cladding layer 45 is epitaxially grown thereon. During the epitaxial growth, the stripe-shaped ridges of the diffraction grating are irradiated with light, and light diffracted by the stripe-shaped ridges is monitored, whereby the moment when the stripe-shaped ridges are completely embedded in the first n type InP upper cladding layer 45 is detected. Therefore, the growth conditions can be controlled with high precision, improving crystal quality and structure controllability.

Figure 10A:
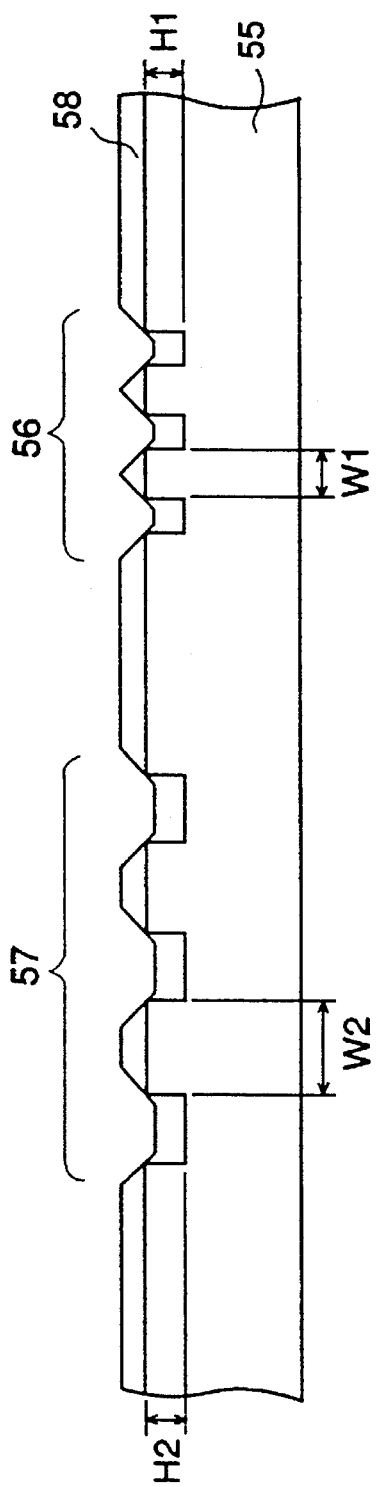
FIGS. 10(a)–10(c) are sectional views for explaining a method for evaluating epitaxial layers in accordance with a third embodiment of the present invention.
Figure 10B:
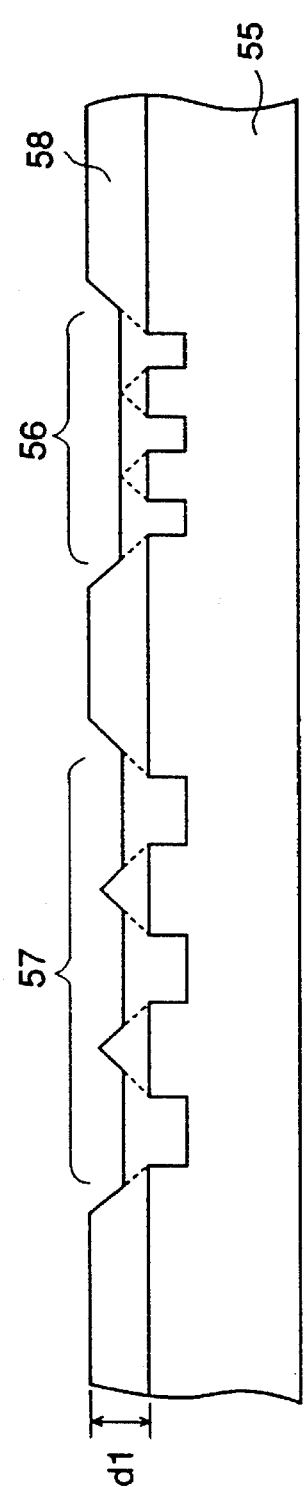
Figure 10C:
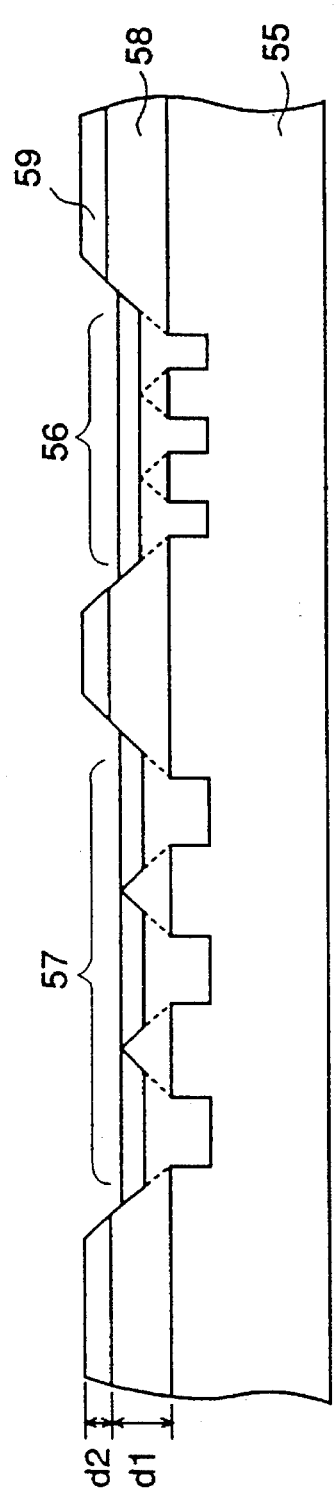

FIGS. 10(a)–10(c) are sectional views for explaining a method for evaluating an epitaxially growing layer in accordance with a third embodiment of the present invention. In these figures, reference numeral 55 designates a GaAs substrate. A first TEG 56 and a second TEG 57 are formed at prescribed positions on the surface of the GaAs substrate 55. The first TEG 56 includes a plurality of stripe-shaped portions of the substrate 55, each having a width W1 and a height H1. The second TEG 57 includes a plurality of stripe-shaped portions of the substrate 55, each having a width W2 and a height H2. A first epitaxial layer 58 is grown on the substrate 55, and a second epitaxial layer 59 is grown on the first epitaxial layer 58.

The widths $W_1$ and $W_2$ have a relation of $W_1<W_2$, and the heights $H_1$ and $H_2$ have a relation of $H_1=H_2$.

Initially, the first epitaxial layer 58 is grown on the substrate 55 including the first and second TEG's 56 and 57. In the step of FIG. 10(a), the epitaxial growth proceeds forming (111)B planes on the stripe-shaped ridges of the respective TEG's 56 and 57, as described in the first embodiment. During the epitaxial growth, the TEG's 56 and 57 are irradiated with light, and diffracted light from the respective TEG's are monitored.

In the step of FIG. 10(b), the moment when only the first TEG 56 is flatly embedded in the first epitaxial layer 58 is detected by the monitoring the light diffracted from the first TEG 56, and the growth of the first epitaxial layer 58 is stopped at this moment. Thus, a first epitaxial layer 58 having a desired thickness $d_1$ approximately equal to 0.7 $W_1+H_1$ is formed on a region of the substrate 55 where the TEG's 56 and 57 are absent. Thereafter, a second epitaxial layer 59 is grown on the first epitaxial layer 58. In the step of FIG. 10(c), the moment when the second TEG 57 is flatly embedded is detected by the monitoring the light diffracted from the second TEG 57, and the growth of the second epitaxial layer 59 is stopped at this moment. Thus, a second epitaxial layer 59 having a desired thickness $d_2$ approximately equal to $(0.7 W_2+H_2)-(0.7 W_1+H_1)$ is formed on the first epitaxial layer 58 in the region where the TEG's 56 and 57 are absent.

Accordingly, the first and second epitaxial layers 58 and 59 are grown to the desired thicknesses with high precision by appropriately selecting the widths $W_1$ and $W_2$ and the heights $H_1$ and $H_2$ of the stripe-shaped ridges of the first and second TEG's 56 and 57, respectively.

While in the above-described third embodiment the first and second TEG's, which are different in size, are formed on the substrate and the thicknesses of the first and second epitaxial layers grown on the substrate are evaluated, three or more TEG's may be formed to evaluate thicknesses of three or more epitaxial layers.

The evaluation method of the present invention is applied to epitaxial growth on a GaAs substrate in the above-described first and third embodiments and to production of an InP laser in the above-described second embodiment. However, the evaluation method of the present invention may be applied to epitaxial growth of other materials.

Figure 11:
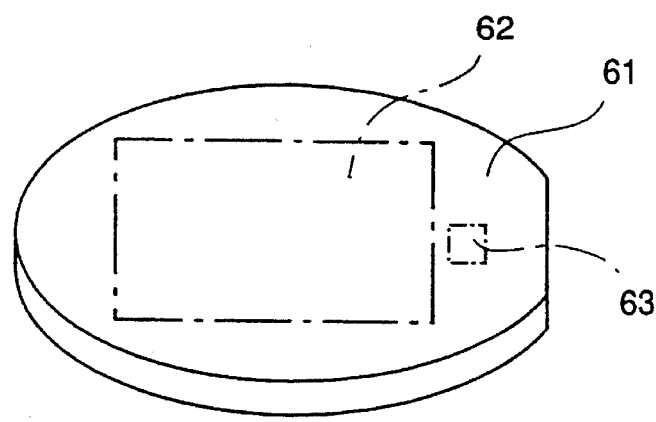
FIG. 11 is a perspective view illustrating a substrate including a test pattern for process evaluation used for evaluating epitaxial layers growing on the substrate, in accordance with a fourth embodiment of the present invention.
Figure 12:
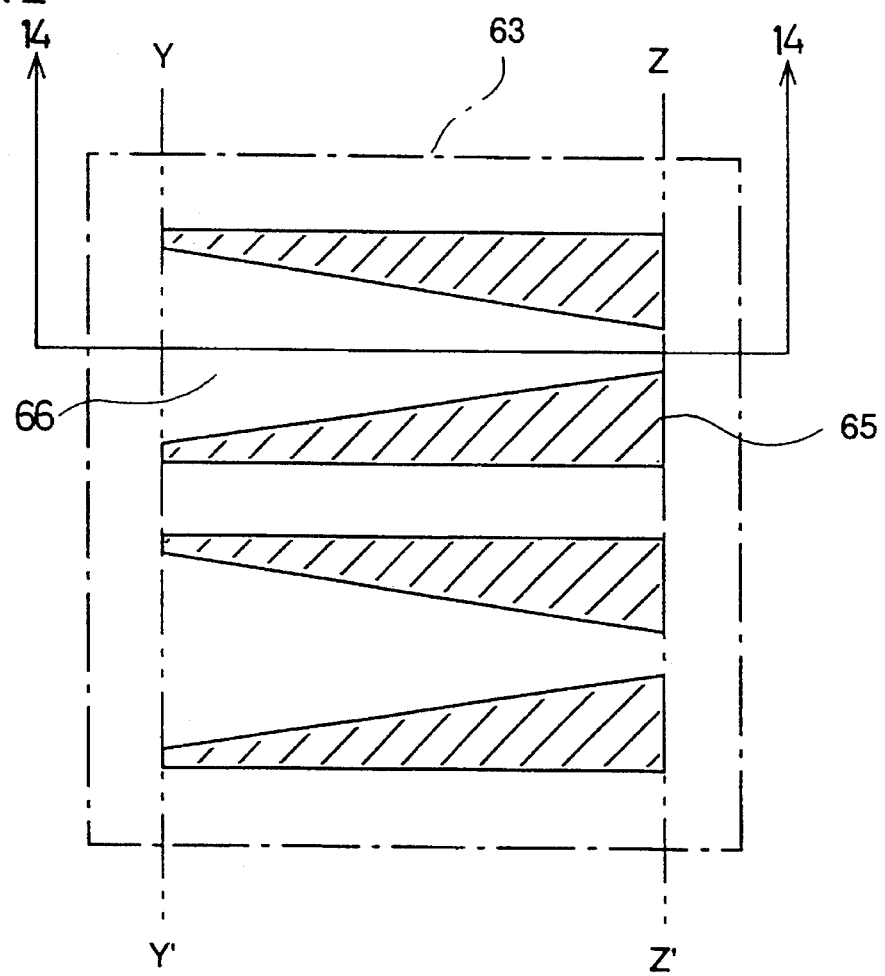

FIG. 11 is a perspective view of a substrate including a TEG for evaluating an epitaxial layer grown on the substrate, in accordance with a fourth embodiment of the present invention. In FIG. 11, reference numeral 61 designates a GaAs substrate having a (100) surface orientation, numeral 62 designates a region where semiconductor elements are formed (hereinafter referred to as element region), and numeral 63 designates a TEG formed on a region of the substrate 61 other than the element region 62. FIG. 12 is an enlarged view of the TEG 63 of FIG. 11. In FIG. 12, reference numeral 65 designates a mask pattern comprising a pair of $SiO_2$ films, and numeral 66 designates an opening of the mask pattern 65.

Figure 14:
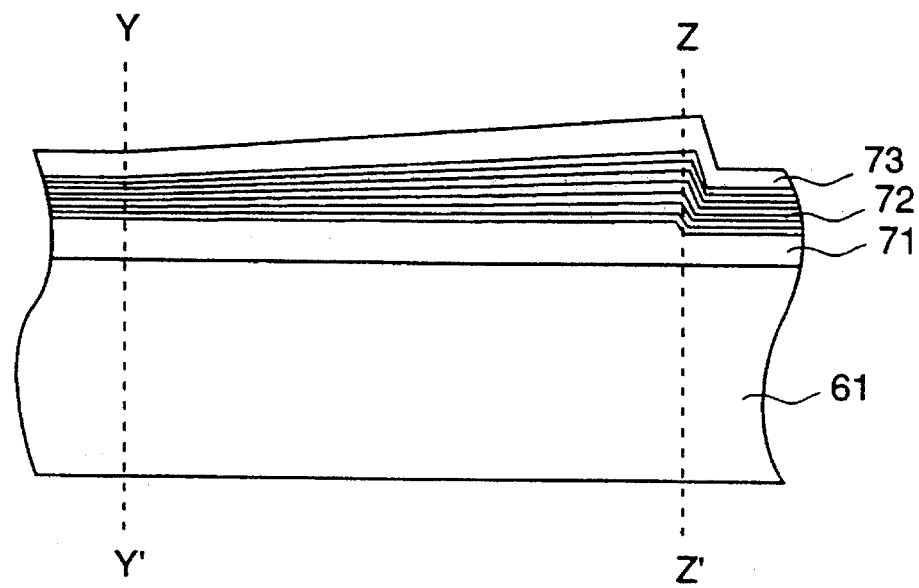
FIG. 14 is a sectional view taken along a line 14—14 of FIG. 12, illustrating epitaxial layers grown on the substrate exposed in the opening of the insulating mask.

FIG. 14 is a sectional view taken along a line 14—14 of FIG. 12, illustrating semiconductor layers including an AlGaAs MQW layer, which are epitaxially grown on the TEG 63 of the substrate 61. In the figure, a first AlGaAs layer 71 is grown on the GaAs substrate 61, an AlGaAs MQW layer 72 is grown on the first AlGaAs layer 71, and a second AlGaAs layer 73 is grown on the MQW layer 72.

A description is given of the evaluation method.

Initially, an $SiO_2$ mask pattern 65 having an opening 66 is formed on the TEG region 63 of the GaAs substrate 61 by vapor deposition and photolithographic techniques. The ratio of the width of the opening 66 to the width of the mask pattern 65 (hereinafter referred to as opening ratio) is gradually varied as shown in FIG. 12. The width of the $SiO_2$ mask pattern 65 is selected so that no polycrystalline film is deposited on the mask pattern in the subsequent crystal growth process. For example, it is less than 10 μm. Thereafter, the first AlGaAs layer 71, the AlGaAs MQW layer 72, and the second AlGaAs layer 73 are grown on the GaAs substrate 61 including the TEG 63, preferably by MOCVD.

Figure 13:
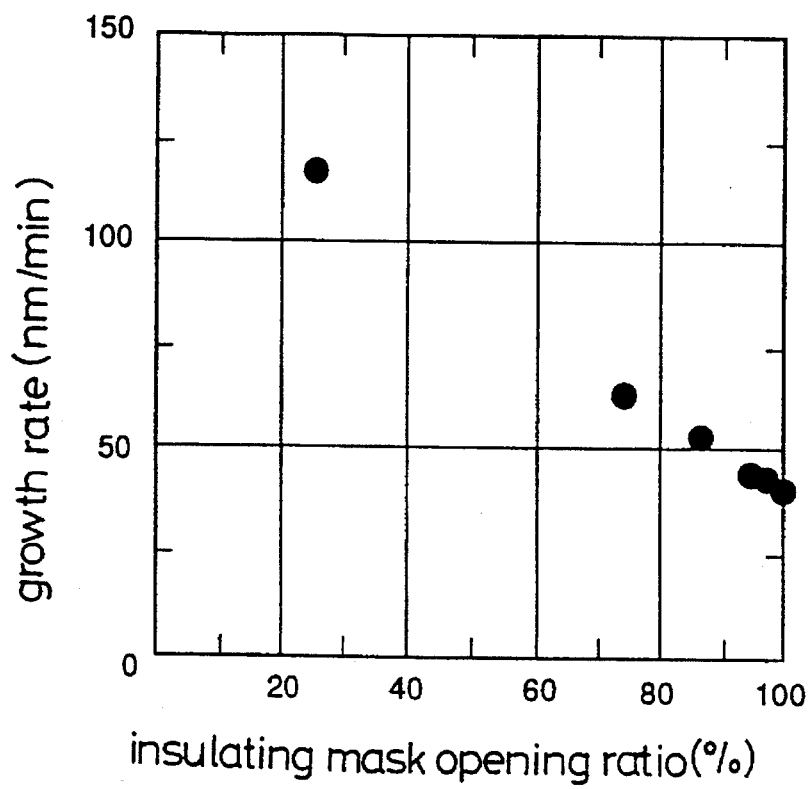
FIG. 13 is a graph illustrating insulating mask opening ratio vs. growth rate characteristics.

FIG. 13 is a graph illustrating the relationship between the growth rate and the opening ratio of the $SiO_2$ mask pattern. As shown in FIG. 13, on the substrate 61 exposed in the opening 66 of the $SiO_2$ mask pattern 65, the thicknesses of those grown layers are increased as the opening ratio is reduced because atoms reaching the $SiO_2$ mask pattern migrate toward the substrate 61 exposed in the opening 66. That is, as shown in FIG. 14, the thicknesses of the grown layers are greater at a position Z–Z' where the opening ratio of the mask pattern is relatively small than at a position Y–Y' where the opening ratio is relatively large. The rate of the increase in the thickness is in proportion to the rate of the decrease in the opening ratio of the mask pattern. In addition, the PL peak wavelength of the AlGaAs MQW layer shifts toward longer wavelength side with an increase in the thickness of the well layer. Therefore, PL wavelengths at different positions of the AlGaAs MQW layer with different opening ratios of the mask pattern 65 produce a distribution of wavelengths.

Figure 15:
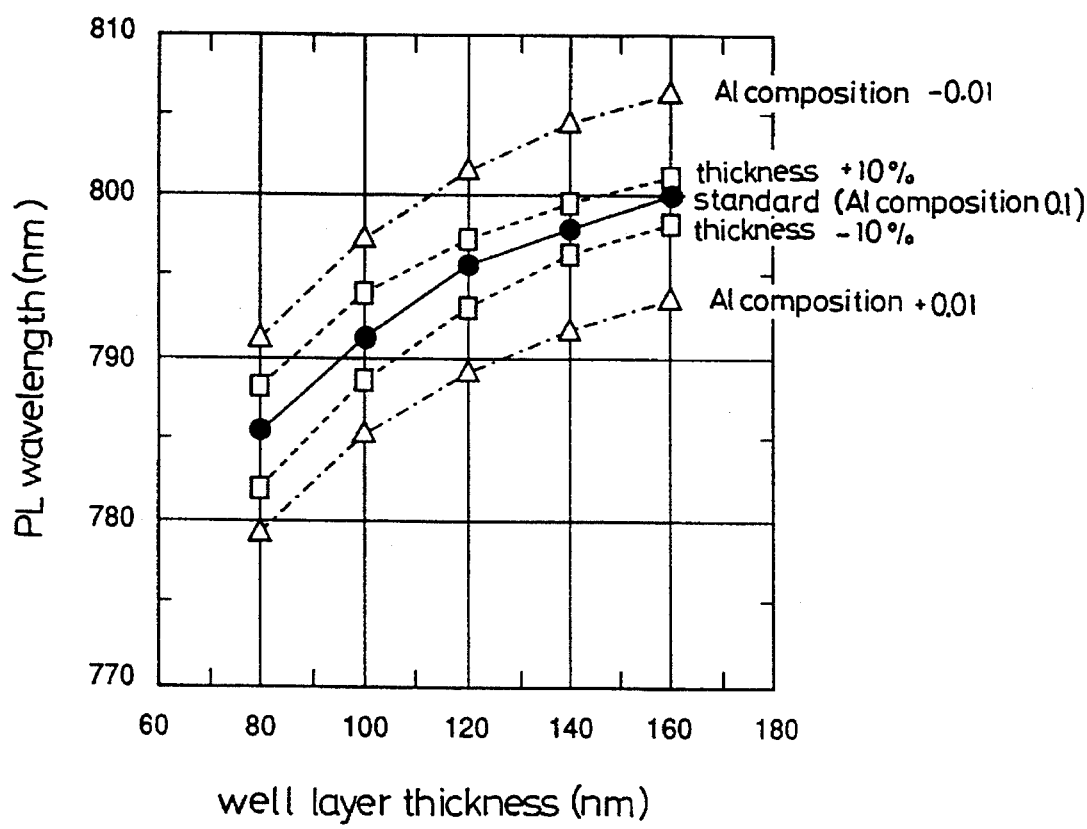
FIG. 15 is a graph illustrating well layer thickness vs. PL wavelength characteristics for explaining an evaluation method according to the fourth embodiment of the present invention.

FIG. 15 is a graph illustrating PL peak wavelength vs. well layer thickness characteristics obtained from the wave function of a quantum well structure. In FIG. 15, the continuous line shows PL peak wavelengths at different well layer thicknesses (standard thicknesses) when the Al composition ratio is 0.1 (standard Al composition ratio). The upper and lower broken lines show PL peak wavelengths at different well layer thicknesses that are by 10% thicker and thinner than the standard thicknesses, respectively, with the standard Al composition ratio. The upper and lower alternating long and short dash lines show PL peak wavelengths at the standard well layer thicknesses when the Al composition ratio is decreased by 0.01 and increased from the standard Al composition ratio, respectively. As shown in FIG. 15, the variation in the distribution of the PL peak wavelengths due to the variation in the well layer thickness shown by the broken line is different from the variation in the distribution of the PL peak wavelengths due to the variation in the Al composition ratio shown by the alternating long and short dash lines. That is, the PL peak wavelengths are sensitive to variation in the well layer thickness and variation in the Al composition ratio.

On the other hand, since the difference in thicknesses of the AlGaAs MQW layer between two positions of the opening 66 of the mask pattern 65 with different opening ratios is obtained from the relationship between the growth rate and the opening ratio shown in FIG. 13, when PL wavelengths at different positions with different opening ratios of the $SiO_2$ mask pattern 65 are measured, a distribution of PL peak wavelengths as a function of the rate of change in the thickness of the well layer included in the epitaxially grown AlGaAs MQW layer is obtained.

The distribution of PL peak wavelengths thus obtained is compared to the standard distribution shown in FIG. 15 which is obtained from the wave function of the quantum well structure. That is, the distribution curve is fitted with theoretical curves obtained by calculations in which the Al composition ratio and the well layer thickness are varied, whereby the thickness and the Al composition of the AlGaAs MQW layer are precisely evaluated.

As described above, in this fourth embodiment of the present invention, an insulating mask pattern 65 with the continuously varied opening ratio is formed on the substrate 61, and the semiconductor layers including the AlGaAs MQW layer 72 are epitaxially grown on the substrate by vapor phase deposition. Thereafter, PL peak wavelengths of the AlGaAs MQW layer grown in the opening 66 of the mask pattern 65 are measured at different positions, and the measured values are compared to the theoretical curves with respect to a standard quantum well structure, whereby the thickness and the Al composition of the AlGaAs MQW layer are evaluated. Therefore, the evaluation of the thickness and the Al composition of the AlGaAs MQW layer is performed with high precision without cleaving the wafer.

Figure 16:
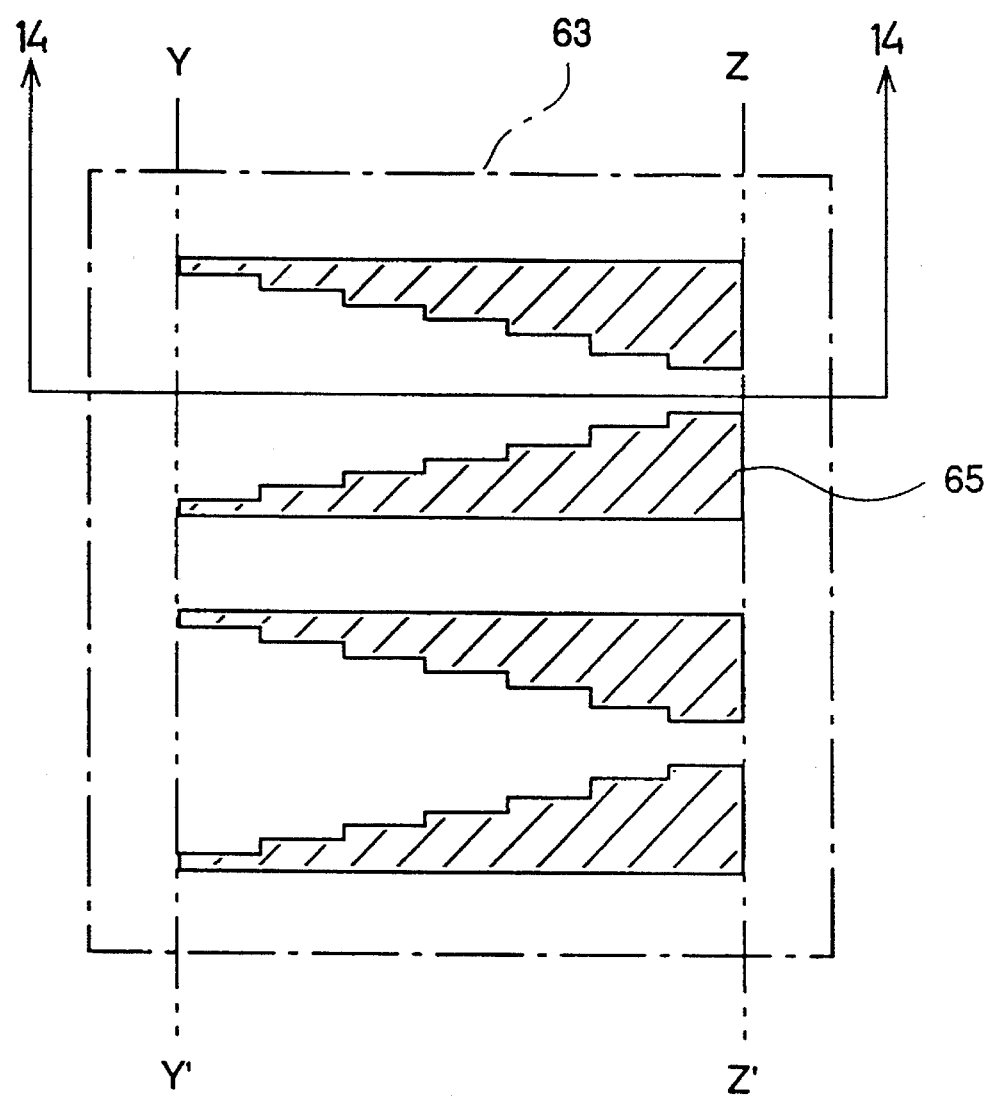
FIG. 16 is a plan view illustrating a variation of the test pattern employed in the evaluation method according to the fourth embodiment of the present invention.
Figure 17:
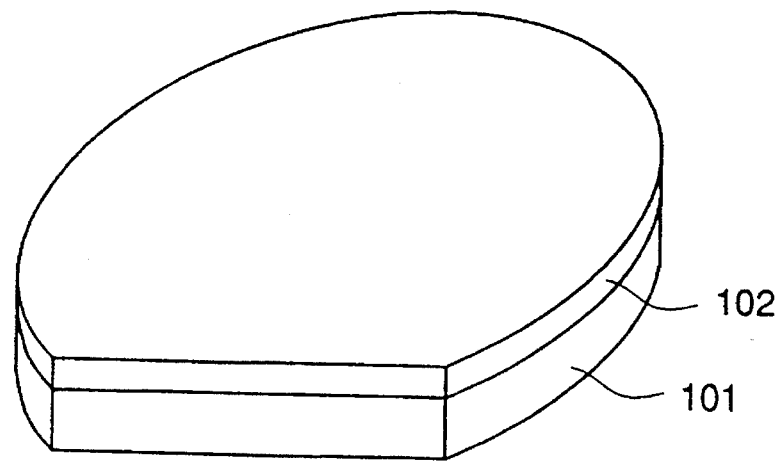
FIGS. 17(a) and 17(b) are perspective views for explaining a method for evaluating the thickness of an epitaxial layer grown on a semiconductor substrate, according to the prior art.
Figure 17:
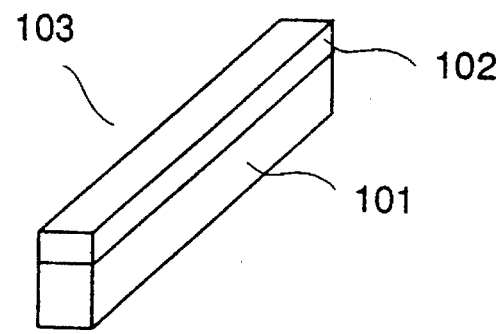

While in the above-described fourth embodiment the opening ratio of the SiO$_2$ mask pattern 65 is continuously varied as shown in FIG. 12, it may be varied in steps as shown in FIG. 16. Also in this case, the same effects as described above are achieved.

What is claimed is:

1. A method for determining the thickness of a crystalline semiconductor layer while epitaxially growing the crystalline semiconductor layer on a first surface of a crystalline semiconductor substrate comprising:

forming a test pattern including a plurality of generally parallel stripe-shaped grooves in a first surface of a crystalline semiconductor substrate, the grooves being separated by respective parallel stripe-shaped ridges having surfaces coplanar with the first surface, the grooves and ridges extending along a predetermined crystalline direction of the substrate;

epitaxially growing a crystalline semiconductor layer on the substrate including in the grooves and on the stripe-shaped ridges using a growth process that causes the crystalline semiconductor layer grown on the surfaces of the ridges to have triangular cross-sections in a plane transverse to the first surface that include sloping surfaces on which further epitaxial growth does not occur; and irradiating the stripe-shaped grooves and ridges with light while growing the crystalline semiconductor layer and monitoring the light diffracted from the stripe-shaped grooves, ridges, and the epitaxially growing crystalline semiconductor layer to determine the thickness of the epitaxially growing crystalline semiconductor layer.

2. The method of claim 1 wherein each of the stripe-shaped ridges has a width W and each of the stripe-shaped grooves has a height H and including epitaxially growing the crystalline semiconductor layer to a thickness just burying the triangular cross-section crystalline semiconductor layer grown on the ridges whereby the epitaxially grown crystalline semiconductor layer has a thickness d, and d=0.7 W+H.

3. The method of claim 1 including epitaxially growing the semiconductor layer while irradiating the grooves and ridges with light in a direction perpendicular to the stripe direction of the ridges.

4. The method of claim 1 including forming the stripe-shaped grooves in a (100) surface of the crystalline semiconductor substrate lying along a [011] direction of the crystalline semiconductor substrate.

5. The method of claim 1 including growing the crystalline semiconductor layer by MOCVD.

6. A method for determining the thickness of a second crystalline semiconductor layer epitaxially growing on a first crystalline semiconductor layer that is disposed on a first surface of a crystalline semiconductor substrate comprising:

forming a test pattern including a plurality of generally parallel stripe-shaped grooves in a first surface of a first crystalline semiconductor layer disposed on a crystalline semiconductor substrate, the grooves being separated by respective parallel stripe-shaped ridges having surfaces coplanar with the first surface, the grooves and ridges extending along a predetermined crystalline direction of the substrate;

epitaxially growing a second crystalline semiconductor layer on the first crystalline semiconductor layer including in the grooves and on the surfaces of the stripe-shaped ridges using a growth process that causes the second crystalline semiconductor layer grown on the surfaces of the ridges to have triangular cross-sections in a plane transverse to the first surface that include sloping surfaces on which further epitaxial growth does not occur; and irradiating the stripe-shaped grooves and ridges with light while growing the second crystalline semiconductor layer and monitoring the light diffracted from the stripe-shaped grooves, ridges, and the epitaxially growing second crystalline semiconductor layer to determine the thickness of the epitaxially growing second crystalline semiconductor layer.

7. The method of claim 6 wherein each of the stripe-shaped ridges has a width W and each of the stripe-shaped grooves has a height H and including epitaxially growing the second crystalline semiconductor layer to a thickness just burying the triangular cross-section second semiconductor layer grown on the ridges whereby the epitaxially grown second crystalline semiconductor layer is d, and d= 0.7 W+H.

8. The method of claim 6 including epitaxially growing the second crystalline semiconductor layer while irradiating the stripe-shaped grooves and ridges with light in a direction perpendicular to the stripe direction of the ridges.

9. The method of claim 6 including growing the second crystalline semiconductor layer by MOCVD.

10. The method of claim 6 including growing the first crystalline semiconductor layer on a (100) surface of the crystalline semiconductor substrate and forming the stripe-shaped grooves in the first crystalline layer along a [011] direction of the crystalline semiconductor substrate.

11. A test pattern for process evaluation formed at a part of a first surface of a crystalline semiconductor substrate for determining the thickness of a crystalline semiconductor layer epitaxially growing on the first surface of the crystalline semiconductor substrate comprising a crystalline semiconductor substrate, a plurality of stripe-shaped grooves in the crystalline semiconductor substrate separated by respective ridges having surfaces coplanar with the first surface of the crystalline semiconductor substrate, the grooves and ridges extending in a direction of the crystalline semiconductor substrate selected so that a crystalline semiconductor layer epitaxially grown in the grooves and on the ridges has, on the surfaces of the ridges, triangular cross-sections transverse to the first surface of the crystalline semiconductor substrate that include inclined surfaces on which further epitaxial growth of the crystalline semiconductor layer does not occur, each stripe-shaped ridge having a width W and each stripe-shaped groove having a height H so that when the crystalline semiconductor layer just buries the triangular cross-section crystalline semiconductor layer grown on the ridges, d=0.7 W+H where d is a desired thickness of the crystalline semiconductor layer epitaxially grown on the crystalline semiconductor substrate.

12. The test pattern of claim 11 wherein the first surface of the crystalline semiconductor substrate is a (100) surface and the stripe-shaped grooves and ridges lie along a [011] direction of the crystalline semiconductor substrate.

13. A method for evaluating an epitaxially grown AlGaAs multiple quantum well layer comprising:

forming an insulating mask pattern having an opening on a part of a crystalline semiconductor substrate, the ratio of the width of the opening to the width of the insulating mask pattern varying;

epitaxially growing a plurality of semiconductor layers including an AlGaAs multiple quantum well layer on the crystalline semiconductor substrate including the insulating mask pattern using a vapor phase growth method producing a thickness of the grown layer that depends upon and varies with the ratio of the width of the opening to the width of the insulating mask pattern; and measuring photoluminescence peak wavelengths of the AlGaAs multiple quantum well layer grown in the opening of the insulating mask pattern at different positions having different opening ratios of the insulating mask pattern and comparing the measured values with theoretical curves calculated for a standard quantum well structure to evaluate the thickness and the Al composition of the AlGaAs multiple quantum well layer.

14. The method of claim 13 including growing the plurality of crystalline semiconductor layers by MOCVD.

15. A method of producing a semiconductor laser including a diffraction grating comprising:

preparing a crystalline semiconductor substrate of a first conductivity type having a (100) surface;

successively growing a first conductivity type crystalline semiconductor lower cladding layer, a crystalline semiconductor active layer, a crystalline semiconductor barrier layer of a second conductivity type opposite the first conductivity type, and a second conductivity type crystalline grating semiconductor layer on the (100) surface of the crystalline substrate;

forming the second conductivity type crystalline grating semiconductor layer into a periodic pattern of stripe-shaped grooves and ridges extending along a [011] direction of the crystalline semiconductor substrate parallel to each other and perpendicular to a resonator length direction of the semiconductor laser;

epitaxially growing a crystalline second conductivity type upper cladding layer on the barrier layer in the grooves and on the ridges of the crystalline grating semiconductor layer using a growth process that causes the upper cladding layer grown on the ridges to have triangular cross-sections transverse to the (100) surface and including sloping surfaces on which further epitaxial growth does not occur;

irradiating the grooves and ridges with light and monitoring the light diffracted from the grooves and ridges to determine the thickness of the upper cladding layer during epitaxial growth of the upper cladding layer; and forming first and second electrodes on the substrate and the upper cladding layer, respectively.

16. The method of claim 15 including growing the upper cladding layer by MOCVD.

\* \* \* \* \*